(12) United States Patent
Mizukami et al.

(10) Patent No.: US 9,401,471 B2
(45) Date of Patent: Jul. 26, 2016

(54) ELECTROMECHANICAL TRANSDUCING DEVICE AND MANUFACTURING METHOD THEREOF, AND LIQUID DROPLET DISCHARGING HEAD AND LIQUID DROPLET DISCHARGING APPARATUS

(75) Inventors: Satoshi Mizukami, Kanagawa (JP); Yoshikazu Akiyama, Kanagawa (JP); Masaru Shinkai, Kanagawa (JP); Osamu Machida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 40 days.

(21) Appl. No.: 13/821,378

(22) PCT Filed: Sep. 5, 2011

(86) PCT No.: PCT/JP2011/070662
§ 371 (c)(1),
(2), (4) Date: Mar. 7, 2013

(87) PCT Pub. No.: WO2012/036103
PCT Pub. Date: Mar. 22, 2012

(65) Prior Publication Data
US 2013/0162726 A1 Jun. 27, 2013

(30) Foreign Application Priority Data

Sep. 15, 2010 (JP) .................. 2010-207364
Sep. 15, 2010 (JP) .................. 2010-207365

(51) Int. Cl.
*H01L 41/047* (2006.01)
*H01L 41/09* (2006.01)
(Continued)

(52) U.S. Cl.
CPC ............ *H01L 41/0973* (2013.01); *B41J 2/045* (2013.01); *B41J 2/14233* (2013.01); *B41J 2/161* (2013.01);
(Continued)

(58) Field of Classification Search
CPC ... Y10T 29/42; B41J 2/04581; B05B 17/0661
USPC .......... 438/21; 29/595, 621.1, 602.1, 603.07, 29/603.14, 25.35, 592.1, 594, 890.09, 29/890.1; 347/70, 68; 427/74
See application file for complete search history.

(56) References Cited

U.S. PATENT DOCUMENTS 5,593,721 A * 1/1997 Daidai et al. .................. 427/100
5,771,555 A * 6/1998 Eda et al. ..................... 29/25.35
(Continued)

FOREIGN PATENT DOCUMENTS

| JP | 11-195768 | 7/1999 |
| JP | 3019845 | 3/2000 |

(Continued)

OTHER PUBLICATIONS

Extended European search report dated Sep. 10, 2013.
Japanese Office Action dated Jun. 24, 2014.
International Search Report Issued Oct. 4, 2011 in PCT/JP2011/070662 filed on Sep. 5, 2011.

*Primary Examiner* — Peter DungBa Vo
*Assistant Examiner* — Kaying Kue
(74) *Attorney, Agent, or Firm* — IPUSA, PLLC

(57) ABSTRACT

A manufacturing method of an electromechanical transducing device includes forming a vibration plate on a substrate; forming a first electrode made of a metal on the vibration plate; forming a second electrode made of an electrically conductive oxide on the first electrode; coating a surface modification material and carrying out surface modification of only the first electrode; forming an electromechanical transducing film on the second electrode; and forming a third electrode made of an electrically conductive oxide on the electromechanical transducing film.

5 Claims, 19 Drawing Sheets

(51) Int. Cl.
*H01L 41/08* (2006.01)
*B41J 2/045* (2006.01)
*B41J 2/14* (2006.01)
*B41J 2/16* (2006.01)
*H01L 27/20* (2006.01)
*H01L 41/29* (2013.01)

(52) U.S. Cl.
CPC .............. *B41J 2/1623* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *H01L 27/20* (2013.01); *H01L 41/0477* (2013.01); *H01L 41/0478* (2013.01); *H01L 41/0805* (2013.01); *H01L 41/29* (2013.01); *B41J 2002/1425* (2013.01); *B41J 2002/14491* (2013.01)

(56) References Cited

U.S. PATENT DOCUMENTS

| | | | | |
|---|---|---|---|---|
| 5,853,514 | A * | 12/1998 | Takeuchi et al. | 156/89.12 |
| 6,115,281 | A * | 9/2000 | Aggarwal et al. | 365/145 |
| 6,146,906 | A * | 11/2000 | Inoue et al. | 438/3 |
| 6,194,228 | B1 | 2/2001 | Fujiki et al. | |
| 6,197,631 | B1 * | 3/2001 | Ishihara | 438/240 |
| 6,198,119 | B1 * | 3/2001 | Nabatame et al. | 257/295 |
| 6,284,421 | B1 * | 9/2001 | Matsuzaki et al. | 430/111.1 |
| 6,362,558 | B1 * | 3/2002 | Fukui | 310/358 |
| 6,528,328 | B1 * | 3/2003 | Aggarwal | H01L 28/75 257/E21.009 |
| 6,534,901 | B1 * | 3/2003 | Tsuzuki | H03H 3/08 310/313 R |
| 6,635,497 | B2 * | 10/2003 | Aggarwal | H01L 21/31691 257/E21.009 |
| 6,913,970 | B2 * | 7/2005 | Inoue | H01L 21/76802 257/295 |
| 7,101,026 | B2 | 9/2006 | Shimada et al. | |
| 7,247,346 | B1 * | 7/2007 | Sager | G01R 31/307 427/162 |
| 7,605,007 | B2 * | 10/2009 | Wang | H01L 27/11502 257/295 |
| 7,897,413 | B2 * | 3/2011 | Wang | H01L 21/32051 257/295 |
| 8,322,828 | B2 | 12/2012 | Ohashi et al. | |
| 8,445,978 | B2 * | 5/2013 | Perruchot | B81B 3/0072 257/415 |
| 8,646,180 | B2 * | 2/2014 | Akiyama | H01L 41/0973 29/890.1 |
| 8,727,509 | B2 * | 5/2014 | Shimofuku | B41J 2/161 347/71 |
| 8,733,904 | B2 * | 5/2014 | Mizukami | B41J 2/161 347/68 |
| 8,770,725 | B2 * | 7/2014 | Watanabe | B41J 2/161 29/25.35 |
| 8,828,750 | B2 * | 9/2014 | Nystrom | B41J 2/14314 347/44 |
| 2001/0030674 | A1 * | 10/2001 | Matsuzawa et al. | 347/70 |
| 2002/0076875 | A1 * | 6/2002 | Wasa et al. | 438/207 |
| 2002/0080213 | A1 * | 6/2002 | Shimada et al. | 347/68 |
| 2002/0097296 | A1 * | 7/2002 | Yamamoto | B41J 2/1433 347/45 |
| 2002/0145648 | A1 * | 10/2002 | Takahashi | B41J 2/161 347/70 |
| 2002/0162687 | A1 * | 11/2002 | Akihiko | H05K 3/389 174/262 |
| 2003/0058310 | A1 * | 3/2003 | Murai | B41J 2/161 347/71 |
| 2003/0109073 | A1 * | 6/2003 | Park | B41J 2/14137 438/21 |
| 2003/0218644 | A1 * | 11/2003 | Higuchi | B41J 2/14201 347/1 |
| 2004/0013794 | A1 | 1/2004 | Hashimoto et al. | |
| 2004/0147046 | A1 * | 7/2004 | Miura | H01L 27/11502 438/3 |
| 2005/0012785 | A1 * | 1/2005 | Furuhata | B41J 2/14233 347/68 |
| 2005/0046312 | A1 * | 3/2005 | Miyoshi | H01L 41/0477 310/366 |
| 2005/0052504 | A1 * | 3/2005 | Murai | B41J 2/14233 347/71 |
| 2005/0140716 | A1 * | 6/2005 | Terui | B41J 2/14129 347/20 |
| 2005/0179342 | A1 * | 8/2005 | Higuchi | B41J 2/14233 310/324 |
| 2005/0213020 | A1 | 9/2005 | Takeda et al. | |
| 2005/0219793 | A1 * | 10/2005 | Matsuda | B41J 2/14233 361/321.2 |
| 2005/0233183 | A1 * | 10/2005 | Hampden-Smith | B01J 21/18 429/492 |
| 2005/0249975 | A1 * | 11/2005 | Sandberg | B82Y 10/00 428/690 |
| 2005/0264617 | A1 * | 12/2005 | Nishimura | B41J 2/14314 347/70 |
| 2006/0128144 | A1 * | 6/2006 | Park | H01L 21/76849 438/643 |
| 2006/0157692 | A1 * | 7/2006 | Wada | H01L 51/0022 257/40 |
| 2006/0214542 | A1 * | 9/2006 | Iwashita | B41J 2/14233 310/364 |
| 2006/0273368 | A1 * | 12/2006 | Ozaki | H01L 27/11502 257/296 |
| 2006/0290747 | A1 * | 12/2006 | Shimada | B41J 2/14233 347/68 |
| 2007/0030317 | A1 * | 2/2007 | Igarashi | B41J 2/1603 347/68 |
| 2007/0164634 | A1 * | 7/2007 | Yao | H01L 41/0946 310/321 |
| 2007/0247782 | A1 * | 10/2007 | Nanataki | H01L 41/0805 361/303 |
| 2008/0035970 | A1 * | 2/2008 | Wang | H01L 21/32051 257/295 |
| 2008/0067618 | A1 * | 3/2008 | Wang | B82Y 10/00 257/415 |
| 2009/0007645 | A1 * | 1/2009 | Shih | B82Y 35/00 73/105 |
| 2009/0066763 | A1 | 3/2009 | Fujii et al. | |
| 2009/0244201 | A1 * | 10/2009 | Saito | B41J 2/14233 347/68 |
| 2009/0321877 | A1 * | 12/2009 | Wang | H01L 27/11507 257/532 |
| 2010/0301436 | A1 * | 12/2010 | Sashida | H01L 21/28556 257/421 |
| 2011/0043573 | A1 * | 2/2011 | Umeda | B41J 2/055 347/68 |
| 2011/0090289 | A1 * | 4/2011 | Mizukami | B41J 2/161 347/68 |
| 2011/0095272 | A1 * | 4/2011 | Ng | G11C 11/22 257/40 |
| 2012/0038712 | A1 | 2/2012 | Akiyama et al. | |
| 2012/0186997 | A1 * | 7/2012 | Li | C12Q 1/00 205/778 |
| 2012/0212545 | A1 * | 8/2012 | Mizukami | B41J 2/14072 347/50 |

FOREIGN PATENT DOCUMENTS

| | | |
|---|---|---|
| JP | 2004-006645 | 1/2004 |
| JP | 2005-135975 | 5/2005 |
| JP | 2005-327919 | 11/2005 |
| JP | 2005-327920 | 11/2005 |
| JP | 2006-060079 | 3/2006 |
| JP | 2006-217721 | 8/2006 |
| JP | 2007-048816 | 2/2007 |
| JP | 2007-281028 | 10/2007 |
| JP | 2009-070955 | 4/2009 |
| JP | 2010-030076 | 2/2010 |
| JP | 2011-009726 | 1/2011 |

* cited by examiner

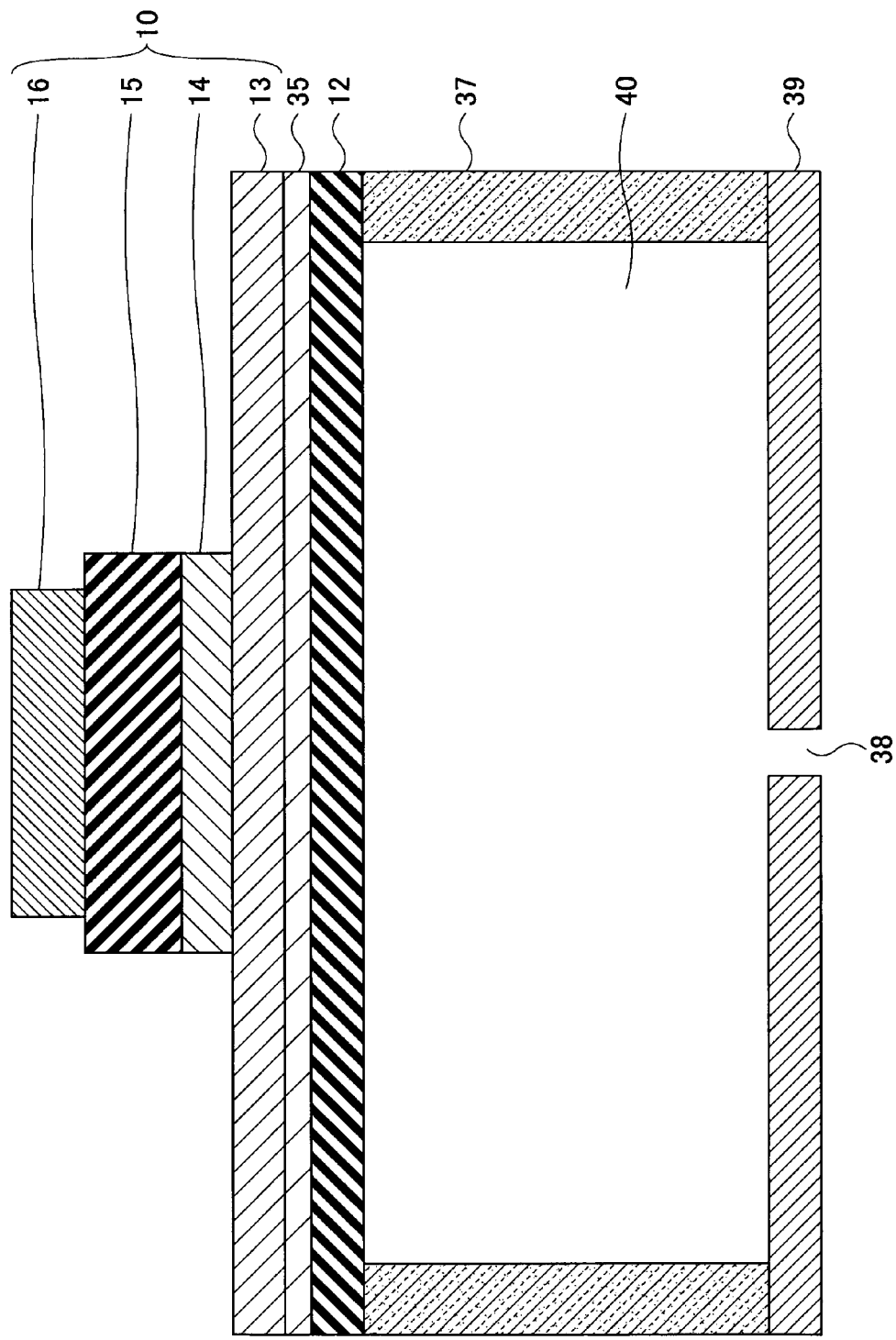

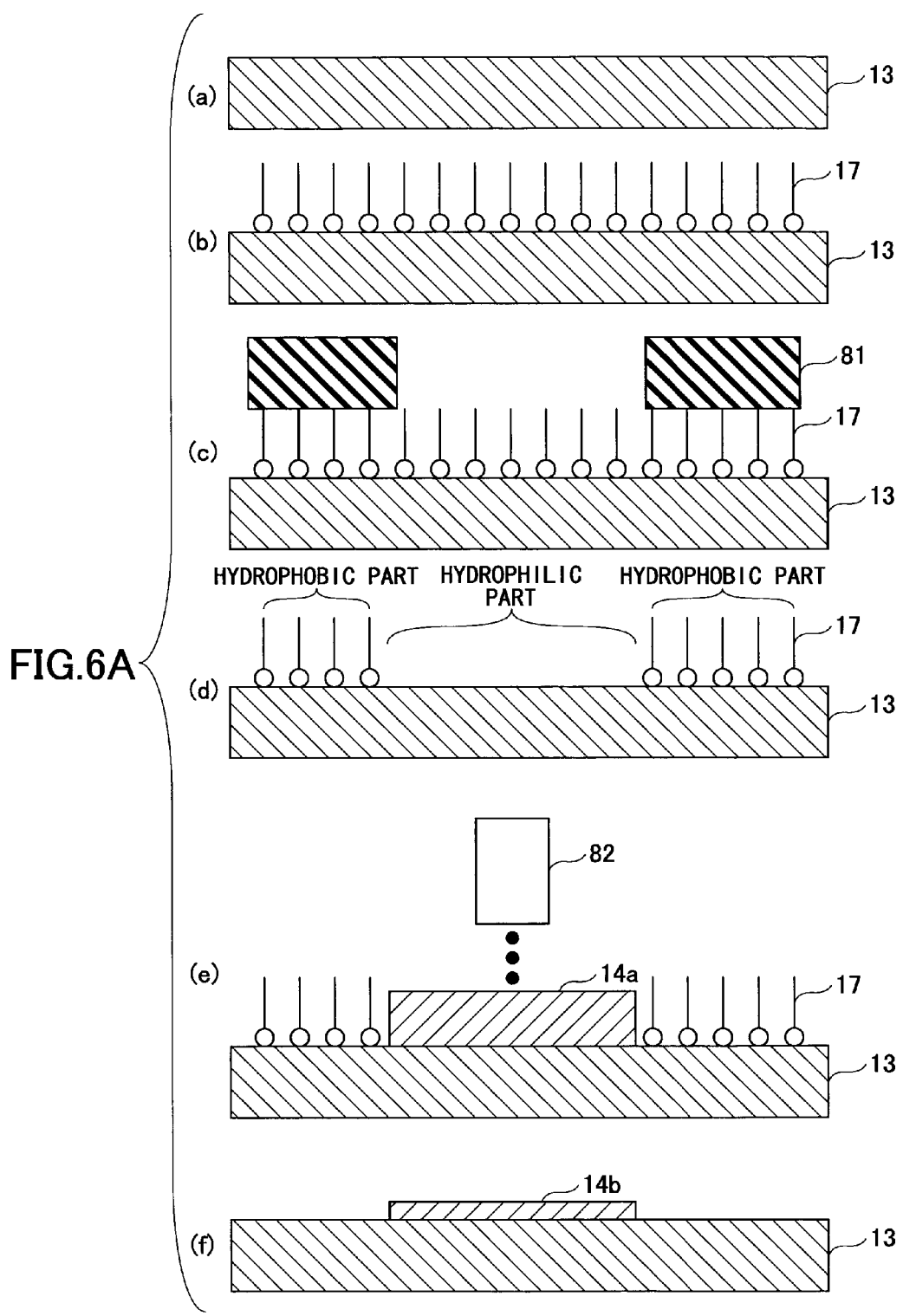

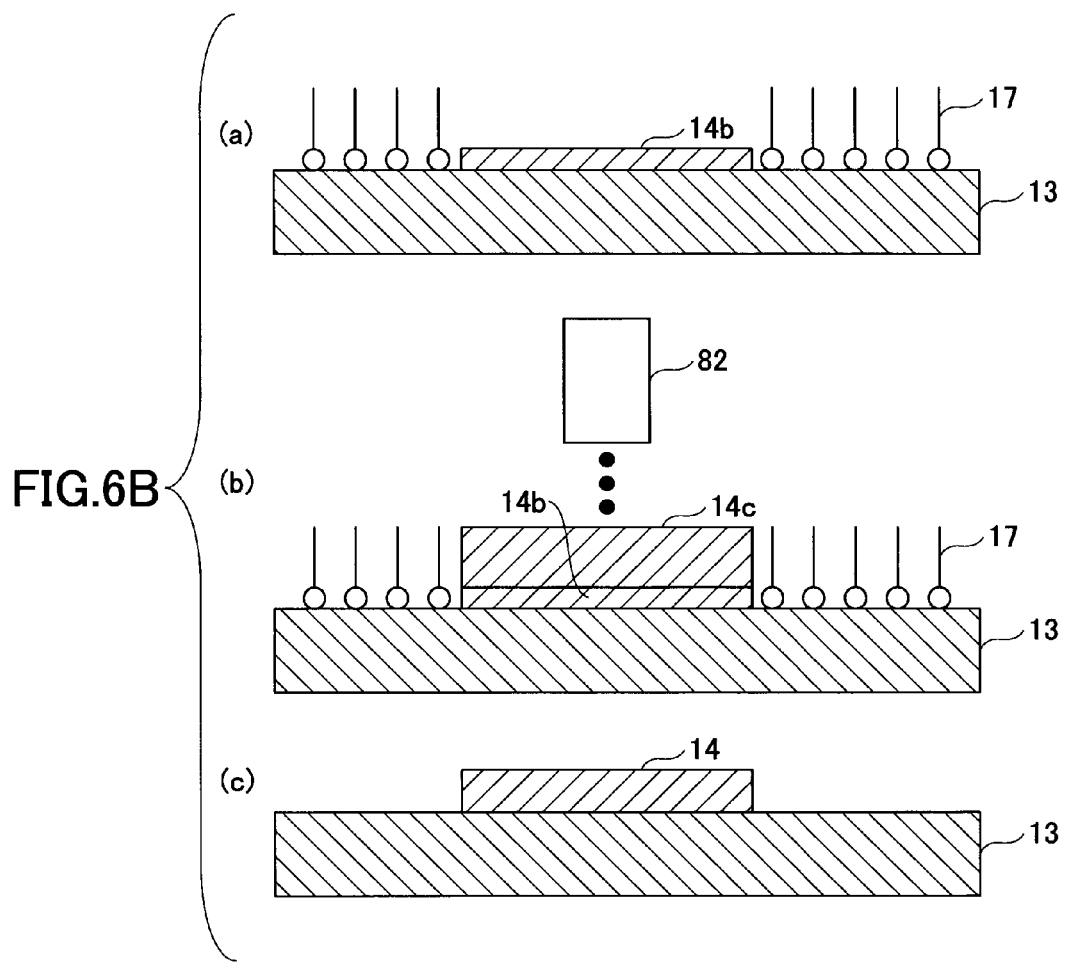

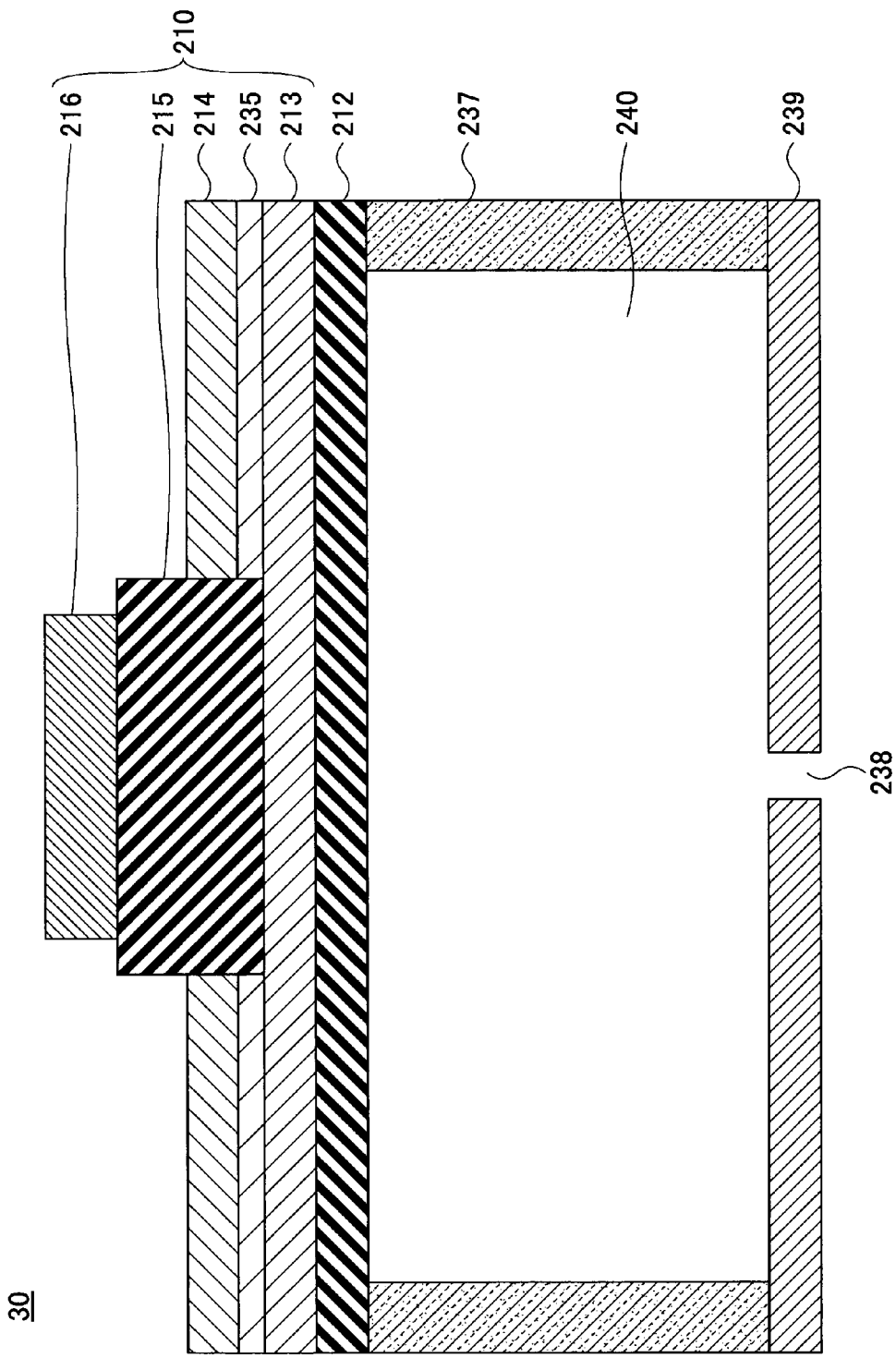

ELECTROMECHANICAL TRANSDUCING DEVICE AND MANUFACTURING METHOD THEREOF, AND LIQUID DROPLET DISCHARGING HEAD AND LIQUID DROPLET DISCHARGING APPARATUS

TECHNICAL FIELD

The present invention relates to an elecromechanical transducing device and a manufacturing method thereof, and a liquid droplet discharging head including the elecromechanical transducing device and a liquid droplet discharging apparatus including the liquid droplet discharging head.

BACKGROUND ART

As an ink-jet recording apparatus used as an image recording apparatus or an image forming apparatus such as a printer, a facsimile machine or a copier and a liquid droplet discharging head, the following configurations are known. The configurations include a nozzle that discharges ink and a pressurization chamber. The pressurization chamber is also called an ink passage, a pressurization liquid chamber, a pressure chamber, a discharging chamber, a liquid chamber or such, and communicates with the nozzle. The configuration further includes an elecromechanical transducing device such as a piezoelectric element pressurizing the ink in the pressurization chamber or an electrothermal element such as a heater, a vibration plate used as a wall of the ink passage, and an energy generation part including an electrode that faces the vibration plate. In this configuration, the ink is pressurized by energy generated by the energy generation part and an ink droplet is discharged from the nozzle.

As the ink-jet recording head, two types have been put into practice. One type uses a piezoelectric actuator of a longitudinal oscillation mode which expands and shrinks in an axial direction of a piezoelectric element. The other type uses a piezoelectric actuator of a flexural oscillation mode. As an ink-jet recording head using the actuator of the flexural oscillation mode, the following one, for example, is known. In the ink-jet recording head, a uniform piezoelectric material layer is formed by a deposition (film forming) technique through the entire surface of a vibration plate, the piezoelectric material layer is scribed into shapes corresponding to pressure generation chambers by a lithography method and piezoelectric elements are formed in such a manner that the respective pressure generation chambers are separated from each other.

However, in the lithography method, an efficiency of using material may be low, and processes may be complicated. Therefore, a high cost may be required and a tact time may be long. In particular, a film thickness of micrometers is required for the piezoelectric material layer. Therefore, forming a fine pattern by a printing method has been studied for the purpose of reducing the cost. For example, a technique has been introduced in which a fine pattern is formed by a printing technique such as an ink-jet method on a pattern substrate on which water repellent and hydrophilic treatment is carried out on the lower layer (for example, see Japanese Laid-Open Patent Applications Nos. 2004-006645 and 2005-327920).

However, in this case, almost all configurations are such that a metallic electrode in which mostly Pt is used as a base is used as a lower electrode, and a guarantee for fatigue characteristics of PZT that is a typical material as the piezoelectric material layer may be worried about. Specifically, degradation of fatigue characteristics caused by diffusion of Pb included in PZT may be worried about. For this point, it has been disclosed that fatigue characteristics of PZT are improved by using an oxide electrode (see Japanese Patent No. 3019845).

However, in a case where an oxide electrode is used, the specific resistance is higher than a metal electrode by approximately 10 through 1000 times. Therefore, when an oxide electrode is provided in common for plural piezoelectric elements, voltage drops occur in a case where many ink droplets are discharged at once as a result of the plural piezoelectric elements being driven. Thus, displacement amounts of the piezoelectric elements may become unstable, and thus, it may not be possible to obtain stable ink discharging characteristics.

SUMMARY OF INVENTION

A manufacturing method of an electromechanical transducing device according to an embodiment of the present invention includes forming a vibration plate on a substrate; forming a first electrode made of a metal on the vibration plate; forming a second electrode made of an electrically conductive oxide on the first electrode; coating a surface modification material and carrying out surface modification of only the first electrode; forming an electromechanical transducing film on the second electrode; and forming a third electrode made of an electrically conductive oxide on the electromechanical transducing film.

According to another aspect of the embodiment of the present invention, an elecromechanical transducing device includes a substrate; a vibration plate formed on the substrate; a first electrode made of a metal formed on the vibration plate, a surface modification material being coated and surface modification being carried out on only the first electrode; a second electrode made of an electrically conductive oxide formed on the first electrode; an electromechanical transducing film formed on the second electrode; and a third electrode made of an electrically conductive oxide formed on the electromechanical transducing film.

A manufacturing method of an electromechanical transducing device according to another embodiment of the present invention includes forming a vibration plate on a substrate; forming a first electrode made of an electrically conductive oxide on the vibration plate; forming a second electrode made of a metal on the first electrode; coating a surface modification material and carrying out surface modification of only the second electrode; forming an electromechanical transducing film on the first electrode; and forming a third electrode made of an electrically conductive oxide on the electromechanical transducing film.

According to another aspect of the other embodiment of the present invention, an electromechanical transducing device includes a substrate; a vibration plate formed on the substrate; a first electrode made of an electrically conductive oxide formed on the vibration plate; a second electrode made of a metal formed on the first electrode, a surface modification material being coated and surface modification being carried out on only the second electrode; an electromechanical transducing film formed on the first electrode; and a third electrode made of an electrically conductive oxide formed on the electromechanical transducing film.

BRIEF DESCRIPTION OF DRAWINGS

FIG. 4 is a sectional view illustrating a liquid droplet discharging head using the electromechanical transducing device according to the first mode for carrying out the present invention;

FIGS. 6A and 6B are sectional views illustrating detailed processes of an ink-jet method according to the first mode for carrying out the present invention;

FIG. 12 is a sectional view illustrating a liquid droplet discharging head using the electromechanical transducing device according to the second mode for carrying out the present invention;

MODES FOR CARRYING OUT THE INVENTION

Figure 1:
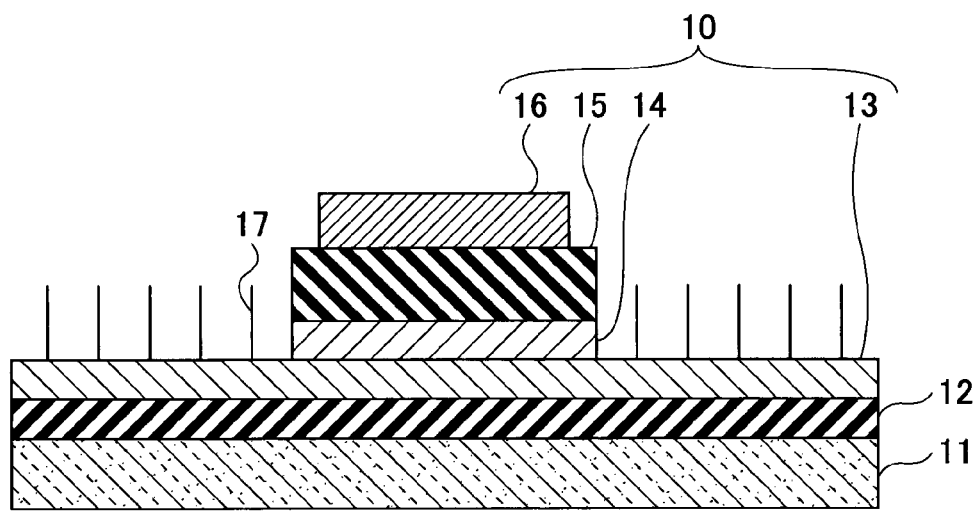
FIG. 1 is a sectional view illustrating an electromechanical transducing device according to a first mode for carrying out the present invention.

According to modes for carrying out the present invention, an electromechanical transducing device and a manufacturing method thereof, a liquid droplet discharging head and a liquid droplet discharging apparatus, where stable ink discharging characteristics can be obtained, are provided.

Below, with reference to figures, modes for carrying out the present invention will be described. In respective figures, the same reference numerals are given to the same/identical parts, respectively, and duplicate description may be omitted.

FIG. 1 is a sectional view illustrating an electromechanical transducing device according to the first mode for carrying out the present invention. As shown in FIG. 1, the electromechanical transducing device 10 includes a first electrode 13, a second electrode 14, an electromechanical transducing film 15, and a third electrode 16. The electromechanical transducing device 10 is formed on a substrate 11 via a vibration plate 12. In the electromechanical transducing device 10, the first electrode 13 is a metal electrode and the second electrode 14 and the third electrode 16 are oxide electrodes. A SAM (Self Assembled Monolayer) film 17 (hereinafter referred to as a SAM film 17) made of alkanethiol or such adheres to a surface of the first electrode 13.

Figure 2A:
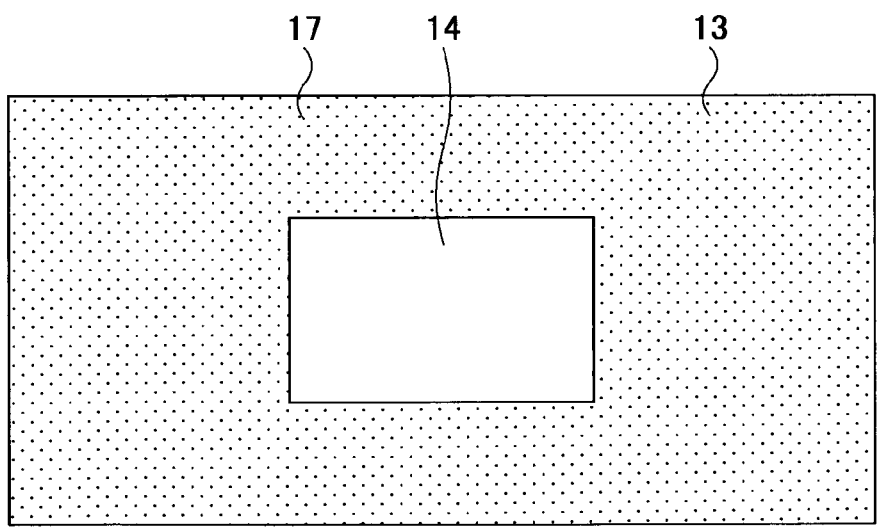
FIGS. 2A and 2B are plan views illustrating a manufacturing method of the electromechanical transducing device according to the first mode for carrying out the present invention.
Figure 2B:
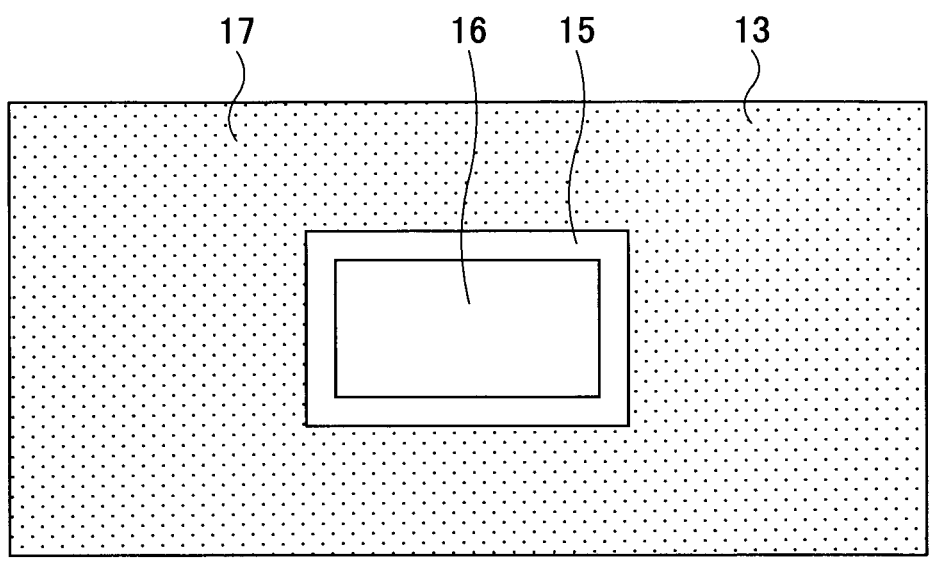

FIGS. 2A and 2B are plan views illustrating a manufacturing method of the electromechanical transducing device according to the first mode for carrying out the present invention. With reference FIGS. 2A and 2B, a manufacturing method of the electromechanical transducing device 10 will now be briefly described.

First, previously, on the substrate 11, the vibration plate 12, the first electrode 13 and the second electrode 14 are laminated in the stated order, and previously the second electrode 14 is processed to have a desired pattern. Next, as shown in FIG. 2A, a SAM material such as alkanethiol is used, and dip treatment is carried out. Thus, the SAM film 17 of the thiol material or such reacts to and adheres to the surface of the first electrode 13 made of the metal. Thereby, the surface state of the first electrode 13 can be made to have water repellency. Further, the SAM material such as the thiol material does not react to the surface of the second electrode 14 made of the oxide, the SAM film 17 does not adhere thereto, and the surface state of the second electrode 14 has a hydrophilic nature. Thus, before the electromechanical transducing film 15 is produced, the second electrode 14 is previously processed to have the predetermined pattern. Thus, only by the dip treatment with the SAM material such as alkanethiol, partial property modification can be carried out for the hydrophilic part and the hydrophobic part in a self alignment manner. Therefore, it is possible to remarkably shorten a tact time of producing the electromechanical transducing film 15.

Next, as shown in FIG. 2B, the electromechanical transducing film 15 and the third electrode 16 are laminated in the stated order on the second electrode 14. Here, in order to produce the electromechanical transducing film 15 to have a film thickness on the order of several micrometers (μm), it is necessary to produce the electromechanical transducing film 15 by laminating several layers by, for example, an ink-jet method. In a case where PZT is used as a material of the electromechanical transducing film 15, 400° C. or more is required as heat treatment temperature, and thus, the SAM film 17 made of alkanethiol or such is removed during the heat treatment. Therefore, after the first layer of PZT is formed on the second electrode 14 and, before each of the second and further subsequent layers of PZT is formed after the heat treatment is carried out, it is necessary to carry out dip treatment on the surface of the lower layer the same as that of FIG. 2A.

Specifically, as will be described later in detail with reference to FIGS. 6A and 6B, also in a case where each of the second and further subsequent layers is laminated after the heat treatment, partial property modification for the hydrophilic part and the hydrophobic part can be carried out in a self-alignment manner only by dip treatment with a SAM material such as an alkanethiol material.

Further, it is also possible that after the dip treatment is carried out using the alkanethiol material and only the surface of the first electrode 13 made of the metal is made to undergo the dip treatment, dip treatment is carried out using an organic silane material in the same way and thus only the surface of the second electrode 14 made of the oxide or the surface of the electromechanical transducing film 15 is made to undergo surface treatment. It is possible to carry out the surface treatment of only the surface of the second electrode 14 made of the oxide since the organic silane material does not react to a metal surface. By using the organic silane material having a group having high hydrophilic nature, it is possible to further give a contrast ratio between the hydrophilic part and the hydrophobic part on the surface. This is further advantageous for when the electromechanical transducing film 15 is produced by an ink-jet method.

Thus, even in the case where PZT is used as the material of the electromechanical transducing film 15, it is possible to avoid diffusion of Pb by using the oxide electrodes as the second electrode 14 and the third electrode 16. Further, by using the metal electrode having the sufficiently low specific resistance as the first electrode 13, it is possible to supply a sufficient electric current to the common electrode when voltage driving is carried out. Thus, it is possible to obtain a sufficient displacement without a variation between devices (elements) in a case where many piezoelectric elements are driven simultaneously. As a result, it is possible to achieve the electromechanical transducing device 10 where it is possible to obtain stable ink discharging characteristics.

Figure 3A:
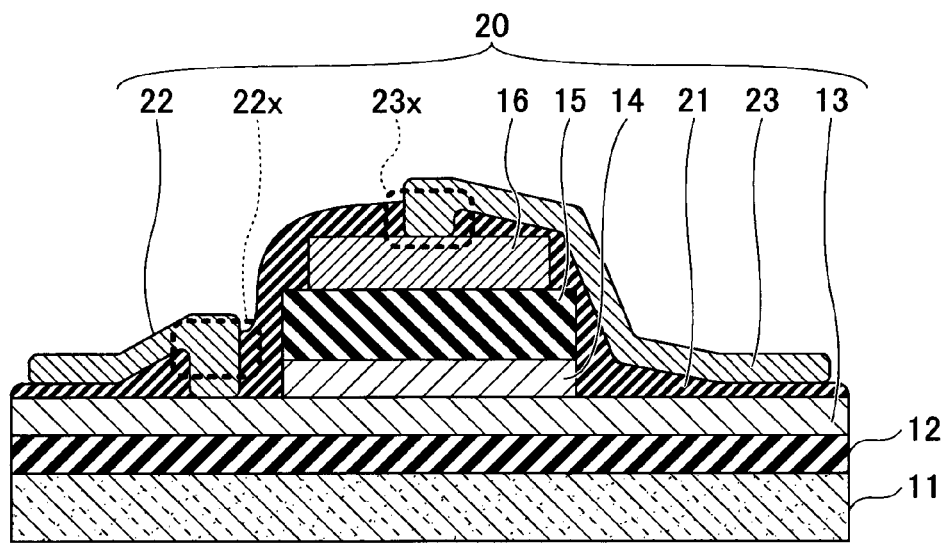
FIG. 3A is a sectional view showing another example of the electromechanical transducing device according to the first mode for carrying out the present invention.
Figure 3B:
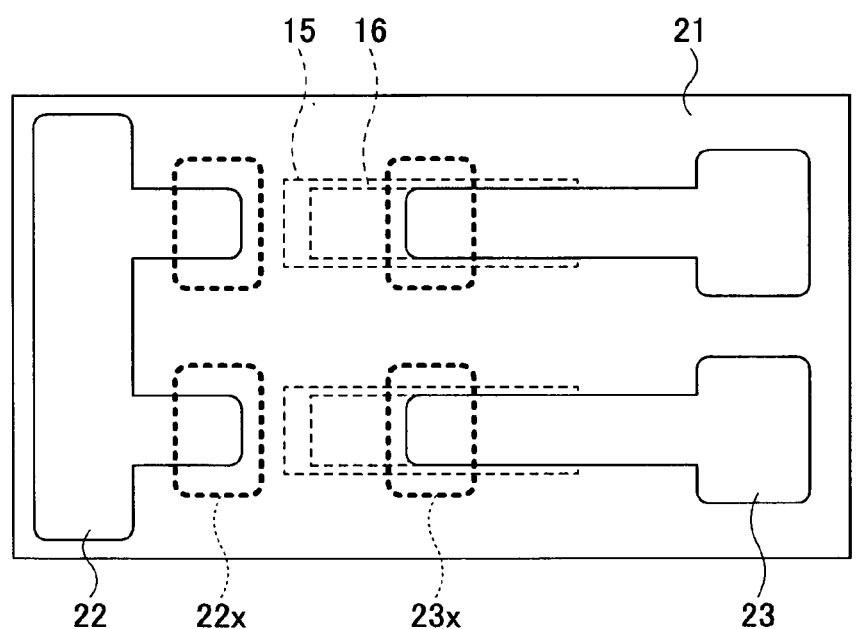
FIG. 3B is a plan view showing the other example of the electromechanical transducing device according to the first mode for carrying out the present invention.

FIG. 3A is a sectional view illustrating another example of the electromechanical transducing device according to the first mode for carrying out the present invention. FIG. 3B is a plan view illustrating the other example of the electromechanical transducing device according to the first mode for carrying out the present invention. As shown in FIGS. 3A and 3B, the electromechanical transducing device 20 has a first electrode 13, second electrodes 14, electromechanical transducing films 15, third electrodes 16, an insulation protection film 21, a fourth electrode 22 and fifth electrodes 23. The electromechanical transducing device 20 is formed on a substrate 11 via a vibration plate 12.

The insulation protection film 21 is formed to cover the first electrode 13, the electromechanical transducing films 15 and the third electrodes 16. The fourth electrode 22 is provided on the insulation protection film 21, and is electrically connected with the first electrode 13 via contact holes 22x passing through the insulation protection film 21. The fifth electrodes 23 are provided on the insulation protection film 21, and are electrically connected with the third electrodes 16 via contact holes 23x passing through the insulation protection film 21. The second electrodes 14, the third electrodes 16 and the fifth electrodes 23 are individual electrodes provided for the respective electromechanical transducing films 15 individually. The first electrode 13 and the fourth electrode 22 are common electrodes provided in common for the respective electromechanical transducing films 15.

By providing the insulation protection film 21 as shown in FIGS. 3A and 3B, it is possible to avoid a failure due to electrical short circuit or destruction of the electromechanical transducing film 15 due to moisture, gas or such.

Next, a liquid droplet discharging head using the electromechanical transducing device according to the first mode for carrying out the present invention will be described. FIG. 4 is a sectional view of the liquid droplet discharging head using the electromechanical transducing device according to the first mode for carrying out the present invention. As shown FIG. 4, the liquid droplet discharging head 30 includes the electromechanical transducing device 10, the vibration plate 12, an adhesive layer 35, a pressure chamber substrate 37 that is a Si substrate, and a nozzle plate 39 on which a nozzle 38 is provided. The adhesive layer 35 is provided for the purpose of enhancing adhesion between the first electrode 13 and the vibration plate 12. A pressure chamber 40 is formed by the vibration plate 12, the pressure chamber substrate 37 and the nozzle plate 39. It is noted that a liquid supply part, a flow passage and fluid resistance are omitted in FIG. 4.

Figure 5:
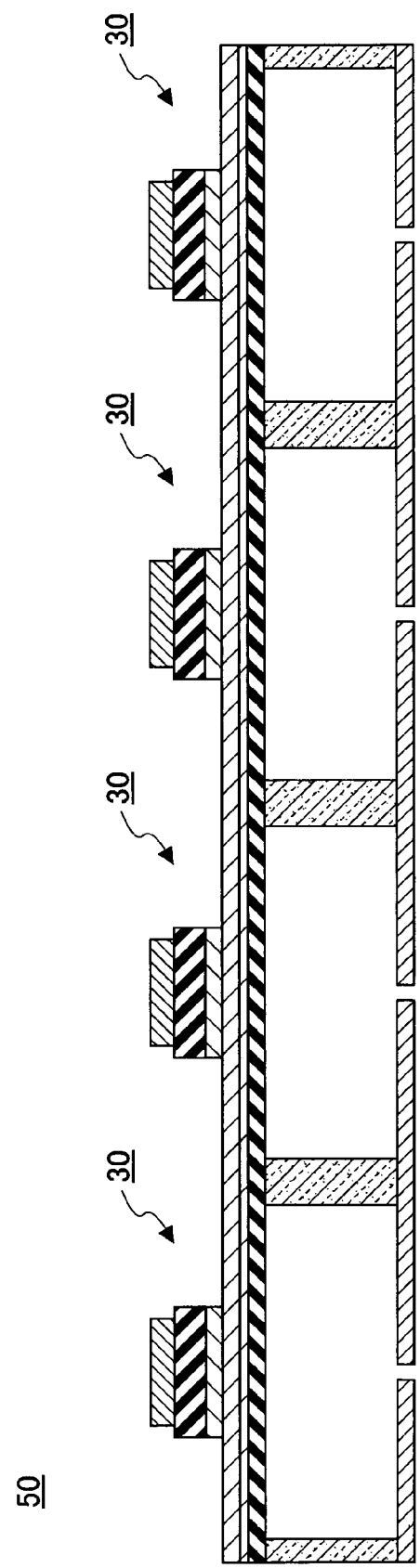
FIG. 5 is a sectional view showing an example in which plural of the liquid droplet discharging heads shown in FIG. 4 are disposed.

FIG. 5 is a sectional view showing an example in which plural of the liquid droplet discharging head of FIG. 4 are disposed. The plural electromechanical transducing devices 10 can be formed on a Si substrate via a vibration plate 12 and an adhesive layer 35, so that the plural electromechanical transducing devices 10 have performance equivalent to that of bulk ceramics, by simple manufacturing processes. After that, in order to form pressure chambers 40, parts of the Si substrate are removed by etching from the reverse side, and a nozzle plate 39 having nozzles 38 is bonded. Thus, a liquid droplet discharging head 50 can be produced. It is noted that a liquid supply part, flow passages and fluid resistance are omitted in FIG. 5.

Next, the respective parts shown in FIGS. 1, 2A, 2B, 3A, 3B and so forth will be described in detail.

[Substrate 11]

As the substrate 11, it is preferable to use a silicon single-crystal substrate, and it is preferable to have a thickness of regularly 100 through 600 µm. As to a plane direction, there are three types, i.e., (100), (110) and (111), and generally in semiconductor industry, (100) and (111) are widely used. In the first mode for carrying out the present invention, mostly a silicon single-crystal substrate having a plane direction of (100) is used. Further, in a case where a pressure chamber 40 such as that shown in FIG. 4 is produced, etching is used and a silicon single-crystal substrate is processed. As a method of etching in this case, it is possible to use anisotropic etching.

The anisotropic etching uses a fact that an etching rate is different with respect to a plane direction of a crystal structure. For example, in anisotropic etching in which an alkaline solution such as KOH is use for dip treatment, an etching rate in plane (111) is on the order of 1/400 in comparison to an etching rate in plane (100). Therefore, in contrast to a structure having an inclination of approximately 54° being able to be produced in plane (100), a deep groove can be formed in plane (110), and thus, it is possible to increase an arrangement density while maintaining rigidity. In the first mode for carrying out the present invention, it is also possible to use a silicon single-crystal substrate having a plane direction of (110). However, in this case, attention is required to a fact that $SiO_2$ that is a mask material is also etched.

[Vibration Plate 12]

In the liquid droplet discharging head 30 shown in FIG. 4, the vibration plate 12 acting as the lower layer of the electromechanical transducing film 15 receives force generated by the electromechanical transducing film 15, is deformed and displaced, and thus causes an ink droplet to be discharged from the pressure chamber 40. Therefore, the vibration plate 12 preferably has predetermined strength. As the vibration plate 12, it is possible to use one produced by a CVD method using a material such as Si, $SiO_2$ or $Si_3N_4$. Further, as a material of the vibration plate 12, it is preferable to use a material having a coefficient of linear expansion close to that of the first electrode 13 and/or the electromechanical transducing film 15.

Especially, in many cases, PZT is used as a material of the electromechanical transducing film 15, and therefore, a material having a coefficient of linear expansion of $5 \times 10^{-6}$ through $10 \times 10^{-6}$ (1/K) close to the coefficient of linear expansion of $8 \times 10^{-6}$ (1/K) of PZT is preferable as the material of the vibration plate 12. Further, a material having a coefficient of linear expansion of $7 \times 10^{-6}$ through $9 \times 10^{-6}$ (1/K) is more preferable as the material of the vibration plate 12.

As a specific material of the vibration plate 12, aluminium oxide, zirconium oxide, iridium oxide, ruthenium oxide, tantalum oxide, hafnium oxide, osmium oxide, rhenium oxide, rhodium oxide, palladium oxide, a compound thereof or such may be used. Using any one of them, it is possible to produce the vibration plate 12 with a spin coater by a sputtering method or a sol-gel process.

As a film thickness of the vibration plate 12, 0.1 through 10 µm is preferable, and 0.5 through 3 µm is more preferable. When the film thickness is smaller than the range, it is difficult to carrying out processing to produce the pressure chamber 40 such as that shown in FIG. 4. When the film thickness is larger than the range, the vibration plate 12 is not easily deformed and displaced and discharging ink drops may become unstable.

[First Electrode 13]

As a metal material to be used for the first electrode 13, for example, platinum having high heat resistance and low reactivity may be used. However, in some cases, platinum does not have a sufficient barrier property against lead. Therefore, it is preferable to use a platinum group element such as iridium or platinum-rhodium, or an alloy film thereof. Further, platinum does not have satisfactory adhesion with the vibration plate 12 (in particular, $SiO_2$) as the lower layer of the first electrode 13. Therefore, in a case where platinum is used as a material of the first electrode 13, it is preferable to laminate the adhesive layer 35 first to be disposed as the lower layer of the first electrode 13, as shown in FIG. 4. As a material of the adhesive layer 35, for example, Ti, $TiO_2$, Ta, $Ta_2O_5$, $Ta_3N_5$ or such may be used. As a method of producing the first electrode 13, a sputtering method or a vacuum evaporation method may be used. As a film thickness of the first electrode 13, 0.05 through 1 µm is preferable, and 0.1 through 0.5 µm is more preferable.

[Second Electrode 14]

In a case where a complex oxide including lead is used as the electromechanical transducing film 15, there may be a case where reaction of lead included in the electromechanical transducing film 15 to the second electrode 14 or diffusion occurs, and piezoelectric characteristics are degraded. Therefore, as a material of the second electrode 14, an electrode material having a barrier property with respect to reaction to/diffusion of lead is required.

As a material of the second electrode 14, using an electrically conductive oxide is effective. As a specific material of the second electrode 14, a complex oxide described as a chemical formula of $ABO_3$ and containing, as main constituents, A=Sr, Ba, Ca or La and B=Ru, CO or Ni, i.e., $SrRuO_3$, $CaRuO_3$, a solid solution thereof, i.e., $(Sr1-x\ Cax)O_3$, $LaNiO_3$, $SrCOO_3$, or a solid solution thereof, i.e., $(La, Sr)(Ni1-y\ COy)O_3$ (y may be 1), may be listed. As another oxide material, $IrO_2$ or $RuO_2$ may also be listed. In other words, a material of the second electrode 14 may be a complex oxide described by the chemical formula of $ABO_3$, containing as main constituents, A which includes any one or more of Sr, Ba, Ca and La, and B which includes any one or more of Bu, Co and Ni, or an oxide being any one of $IrO_2$ and $RuO_2$.

As a manufacturing method of the second electrode 14, it is possible to produce it with a spin coater by a sputtering method or a sol-gel process. In this case, patterning is required, and a desired pattern is obtained by photolithoetching or such. As another method, the area on the first electrode 13 as the lower layer other than the area on which the second electrode 14 is to be formed may be made to undergo surface modification to have water repellency; and the second electrode 14 may be formed using an ink-jet method on the area which is to form the second electrode 14 and is not made to have the water repellency but rather has hydrophilicity. It is noted that the area to form the second electrode 14 is an area to which the patterned second electrode 14 is to be formed.

Here, with reference to FIGS. 6A and 6B, detailed processes by the ink-jet method according to the first mode for carrying out the present invention will be described.

First, as shown in FIG. 6A, (a), the first electrode 13 to act as the lower layer is prepared. Then, as shown in FIG. 6A, (b), the SAM film 17 (Self Assembled Monolayer) is coated on the entire surface of the first electrode 13. As the SAM film 17, although it is different depending on the material of the lower layer, mostly thiol is selected in a case where a metal is used as the lower layer. Although reactivity and/or hydrophobic (water repellent) nature is different depending on the molecule chain length, molecules of C6 through C18 are dissolved into a common organic solvent (alcohol, acetone or toluene) (concentration: several moles/l). Using the solution, the entire surface coating process is carried out by any one of a dip treatment, vapor, a spin coater and so forth, extra molecules are replaced and cleaned with the solvent, and drying is carried out. Thus, the SAM film 17 can be formed on the surface of the first electrode 13.

Then, as shown in FIG. 6A, (c), a pattern of a photoresist 81 is formed by photolithography. Next, as shown in FIG. 6A, (d), by dry etching, the part of the SAM film 17 not covered by the photoresist 81 is removed. Further, the photoresist 81 is removed. Thus, patterning of the SAM film 17 is finished.

Next, as shown in FIG. 6A, (e), a liquid discharging head 82 is used to coat liquid droplets. Thus, the coated film is not formed on the SAM film 17 that is the hydrophobic part, and a patterned precursor coated film 14a is formed on only the hydrophilic part from which the SAM film 17 is removed. After that, heat treatment is carried out according to a regular sol-gel process. Heat treatment temperatures for the patterned precursor coated film 14a are organic matter's burning temperature, i.e., 300 through 500° C., crystallization temperature, i.e., 500 through 700° C., and so forth. Through the high temperature treatment, as shown in FIG. 6A, (f), the SAM film 17 is removed, and a patterned precursor coated film 14b obtained from the heat treatment of the patterned precursor coated film 14a is produced.

In a case where the ink-jet method is used, a film thickness is approximately 30 through 100 nm per one layer. Therefore, it is necessary to laminate several layers. For this purpose, as shown in FIG. 6B, (a), the SAM film 17 is again patterned, and the SAM film 17 is formed around the patterned precursor coated film 14b. Then, as shown in FIG. 6B, (b), liquid droplets are coated by the liquid droplet discharging head 82, and a patterned precursor coated film 14c is formed on the patterned precursor coated film 14b which is a hydrophilic part where the SAM film 17 is removed. After that, heat treatment the same as that described above with reference to FIG. 6A, (e) is carried out. By repeating the processes of FIG. 6B, (a) and FIG. 6B, (b), the patterned precursor coated film has a predetermined film thickness, as shown in FIG. 6B, (c), and the second electrode 14 is obtained. As a film thickness of the second electrode 14, 0.05 through 1 µm is preferable, and 0.1 through 0.5 µm is more preferable. Thus, the second electrode 14 patterned by the ink-jet method is obtained.

It is noted that in FIGS. 6A and 6B, an example has been described where the second electrode 14 is formed on the first electrode 13 acting as the lower layer by the ink-jet method. However, for example, the same processes may be used also for a case where the electromechanical transducing film 15 is formed on the second electrode 14 acting as the lower layer by an ink-jet method, a case where the third electrode 16 is formed on the electromechanical transducing film 15 acting as the lower layer by an ink-jet method, or such. Furthermore, the same processes may be used also for, in the second mode for carrying out the present invention described later with reference to FIGS. 9 through 14, a case where an electromechanical transducing film 215 is formed on a first electrode 213 acting as the lower layer by an ink-jet method, a case where a third electrode 216 is formed on the electromechanical transducing film 215 acting as the lower layer by an ink-jet method, or such.

[Electromechanical Transducing Film 15]

According to the first mode for carrying out the present invention, as a material of the electromechanical transducing film 15, mostly PZT is used. PZT is a solid solution of lead zirconate ($PbZrO_3$) and lead titanate ($PbTiO_3$), and has characteristics that are different depending on a ratio thereof. A composition showing superior piezoelectric characteristics has a ratio of 53:47 between $PbZrO_3$ and $PbTiO_3$, is indicated by a chemical formula of $Pb(Zr0.53, Ti0.47)O_3$, and is generally indicated as PZT(53/47). As a complex oxide other than PZT, barium titanate or such may be used. In this case, a barium alkoxide and titanium alkoxide compound may be used as a starting material, it may be dissolved into a common solvent, and thus, a barium titanate precursor solution may be produced.

These materials are described by a general formula $ABO_3$, and complex oxides containing, as main constituents, A=Pb, Ba or Sr and B=Ti, Zr, Sn, Ni, Zn, Mg or Nb, corresponds thereto. Specific descriptions thereof include $(Pb1-x, Ba)(Zr, Ti)O_3$ and $(Pb1-x, Sr)(Zr, Ti)O_3$ in a case where Ba or Sr is used to substitute for part of Pb on A site. Such a substitution may be carried out by using a divalent element, and an advantageous effect thereof is to reduce degradation in characteristics occurring due to evaporation of lead during heat treatment.

As a method of producing the electromechanical transducing film 15, it is possible to produce it by a sputtering method or a sol-gel process using a spin coater. In this case, patterning is required. Therefore, a desired pattern is obtained by photolithoetching or such. In a case where PZT is produced by a sol-gel process, it is possible to produce a PZT precursor solution by using a lead acetate, zirconium alkoxide and titanium alkoxide compound as a starting material, dissolving it using methoxyethanol as a common solvent, and obtaining a uniform solution. Since a metal alkoxide compound is easily hydrolyzed by moisture in the atmosphere, acetylacetone, acetic acid, diethanolamine or such may be added to the precursor solution as a stabilizer by an appropriate amount.

In a case of obtaining the PZT film on the entire surface of the lower substrate, it is possible to obtain it by forming a coated film by a solution coating method such as spin coating, and carrying out respective heat treatments of drying solvent, thermal decomposition and crystallization. Since volume shrinkage occurs along with transformation from the coated film into the crystallized film, adjustment of the precursor concentration is required so that a film thickness of equal to or less than 100 nm through one time of the process can be obtained, in order to obtain a crack-free film.

Further, when the electromechanical transducing film 15 is obtained by an ink-jet method, it is possible to obtain a patterned film by the same flow as the flow (see FIGS. 6A and 6B) for the second electrode 14. As to the surface modification material, although it is different depending on the material of the lower layer, mostly a silane compound is selected in a case where an oxide is used as the lower layer, and mostly alkanethiol is selected in a case where a metal is used as the lower layer.

As a film thickness of the electromechanical transducing film 15, 0.5 through 5 μm is preferable, and 1 through 2 μm is more preferable. When the film thickness is smaller than the range, it may not be possible to generate sufficient displacement. When the film thickness is larger than the range, the number of processes for laminating layers is increased, and the process time period is made longer.

[Third Electrode 16]

As a material of the third electrode 16, it is advantageous to use an electrically conductive oxide, the same as for the second electrode 14. As a specific material of the third electrode 16, a complex oxide described as a chemical formula of $ABO_3$ and containing, as main constituents, A=Sr, Ba, Ca or La and B=Ru, CO or Ni, i.e., $SrRuO_3$, $CaRuO_3$, a solid solution thereof, i.e., $(Sr1-x\ Cax)O_3$, $LaNiO_3$, $SrCOO_3$, or a solid solution thereof, i.e., $(La, Sr)(Ni1-y\ COy)O_3$ (y may be 1), may be listed. As another oxide material, $IrO_2$ or $RuO_2$, may also be listed. Further, it is also advantageous to use, on the electrically conductive oxide, in order to supplement for wiring resistance, a platinum group element such as platinum, iridium or platinum-rhodium, an alloy film thereof, Ag alloy, Cu, Al or Au.

As a method of producing the third electrode 16, it is possible to produce it with a spin coater by a sputtering method or a sol-gel process. In this case, patterning is required, and a desired pattern is obtained by photolithoetching or such. Other than it, it is also possible to produce a patterned film by an ink-jet method using a process of carrying out partial surface modification on the second electrode 14 and the lower layer. For the case where it is produced by the ink-jet method, the patterned film can be obtained by a producing flow the same as that (see FIGS. 6A and 6B) for the second electrode 14. As a film thickness of the third electrode 16, 0.05 through 1 μm is preferable, and 0.1 through 0.5 μm is more preferable.

[Insulation Protection Film 21]

The insulation protection film 21 is provided for the purpose of avoiding a failure due to electrical short circuit or destruction of the electromechanical transducing film 15 due to moisture, gas or such. As a material of the insulation protection film 21, an inorganic film such as a silicon oxide film, a silicon nitride film or a silicon oxynitride film, or an organic film such as a polyimide or parylene film is preferable. As a film thickness of the insulation protection film 21, 0.5 through 20 μm is preferable, and 1 through 10 μm is more preferable. When the film thickness of the insulation protection film 21 is smaller than the range, the function as the insulation protection film 21 cannot be sufficiently carried out. When the film thickness of the insulation protection film 21 is larger than the range, the process time period becomes longer.

As a method of producing the insulation protection film 21, it is possible to use CVD, a sputtering method, a spin coating method or such. Further, it is necessary to produce the contact holes 22x and 23x for electrically connecting the fourth electrode 22 and the fifth electrodes 23 with the first electrode 13 and the third electrodes 16, respectively. For this purpose, a desired pattern is obtained by photolithoetching or such.

It is also possible to produce the insulation protection film 21 having the contact holes 22x and 23x by one time of a process using a screen printing method. As a paste material used in the screen printing method, it is possible to use one obtained from dissolving resin and inorganic or organic particles into an organic solvent. As the resin, a material containing polyvinyl alcohol resin, polyvinyl acetal resin, acrylic resin, ethyl cellulose resin or such may be used. As the inorganic particles, silica ($SiO_2$), alumina ($Al_2O_3$), titanium oxide ($TiO_2$), zinc oxide (ZnO), barium titanate ($BaTiO_3$) or such may be used. Thereamong, a material having a relatively low dielectric constant such as silica, alumina or zinc oxide is preferable.

In a case where a pattern having fineness that is assumed in the first mode for carrying out the present invention is formed, the insulation protection film 21 is formed by transferring the paste material supplied in a mesh having a line diameter of 15 through 50 μm and an open area ratio of 40 through 60%. Therefore, it is possible to form the insulation protection film 21 together with the contact holes 22x and 23x.

[Fourth Electrode 22, Fifth Electrodes 23]

As a material of the fourth electrode 22 and the fifth electrodes 23, a metal electrode material made of any one of Ag alloy, Cu, Al, Pt and Ir is preferable. The fourth electrode 22 and the fifth electrodes 23 may be produced by, for example, a sputtering method, a spin coating method or such, and after that, a desired pattern may be obtained by photolithoetching or such. Further, it also possible to produce a patterned film by an ink-jet method using a process of carrying out partial surface modification on the surface of the insulation protection film 21 that is the lower layer. In the case of producing them by the ink-jet method, the patterned film can be obtained by a flow the same as that (see FIGS. 6A and 6B) for the second electrode 14.

As the surface modification material, mostly a silane compound is selected in a case where the insulation protection film 21 as the lower layer is an oxide. Further, in a case where the insulation protection film 21 is organic matter such as polyimide (PI), it is possible to increase surface energy of an area where ultraviolet light is irradiated. As a result, it is possible to directly draw a very fine pattern of the fourth electrode 22 and the fifth electrodes 23 at the areas at which the surface energy is increased, by an ink-jet method. As a polymeric material with which surface energy can be increased by ultraviolet light, a material, described in Japanese Laid-Open Patent Application No. 2006-060079, or such, may be used.

Further, it is also possible to obtain the electrode films acting as the fourth electrode 22 and the fifth electrodes 23 by a screen printing method using the following paste material on the market: Perfect gold (registered trademark) (a gold paste, a product name of Vacuum Metallurgical Co., Ltd.), Perfect copper (a copper paste, a product name of Vacuum Metallurgical Co., Ltd.), OrgacOnPastevariant 1/4, Paste variant 1/3 (both transparent PEDOT/PSS ink for printing, product names of Agfa-Gevaert Japan), OrgacOnCarbOn-Paste variant 2/2 (a carbon electrode paste, a product name of Agfa-Gevaert Japan), or BAYTRON (registered trademark) P (PEDT/PSS aqueous solution, a product name of H.C. Stark-V TECH Ltd.).

As a film thickness of the fourth electrode 22 and the fifth electrodes 23, 0.1 through 20 μm is preferable, and 0.2 through 10 μm is more preferable. When the film thickness of the fourth electrode 22 and the fifth electrodes 23 is smaller than the range, the resistance becomes larger, and it is not possible to sufficiently flow electric currents through the electrodes, whereby the discharging from the head becomes unstable. When the film thickness of the fourth electrode 22 and the fifth electrodes 23 is larger than the range, the process time period is elongated.

Below, embodiments of the first mode for carrying out the present invention will be described.

Embodiment 1

A thermal oxide film (film thickness: 1 μm) was formed on a silicon wafer, and a titanium film (film thickness: 50 nm) as the adhesive layer 35 and then a platinum film (film thickness: 200 nm) as the first electrode 13 were formed by sputtering. The adhesive layer 35 made of the titanium film acts as a part of improving adhesion between the thermal oxide film and the platinum film. Next, a SrRuO film (film thickness: 200 nm) as the second electrode 14 was formed by sputtering. After that, a film of photoresist (TSMR8800) made by Tokyo Ohka Kogyo Co., Ltd. was formed by a spin coating method. Then, a resist pattern 81 was formed by regular photolithography. After that, a pattern shown in FIGS. 1 and 2A was formed using an ICP etching apparatus made by SAMCO Inc.

Next, as surface treatment of the first electrode 13, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. The contact angle for water on the platinum film after the SAM process was 92.2°. In contrast thereto, the contact angle for water on the SrRuO film was 15°. Thereby, it was confirmed that contrast between the hydrophilic surface and the water repellent surface was sufficient for when the electromechanical transducing film 15 was thereafter produced by an ink-jet method.

Next, as the electromechanical transducing film 15, a film of PZT (53/47) was formed by an ink-jet method. Synthesizing of the precursor coating liquid was carried out using lead acetate trihydrate, titanium isopropoxide and zirconium isopropoxide were used as starting materials. As to water of crystallization in the lead acetate, dissolving into methoxyethanol was carried out, and then, dehydration was carried out. The amount of lead was made excessive by 10 mole percent with respect to the stoichiometric composition. This is for the purpose of avoiding degradation in crystallinity due to a reduction of lead through heat treatment.

Titanium isopropoxide and zirconium isopropoxide were dissolved into methoxyethanol, alcohol exchange reaction and esterification reaction were proceeded with, and mixing with the methoxyethanol into which the above-mentioned lead acetate was dissolved was carried out. Thus, a PZT precursor solution was synthesized. The PZT concentration thereof was set to be 0.1 moles/l. The PZT precursor solution was coated, by an ink-jet coating apparatus, on the hydrophilic area (the SrRuO film produced as the second electrode 14) patterned by the photolithoetching as mentioned above.

Figure 7:
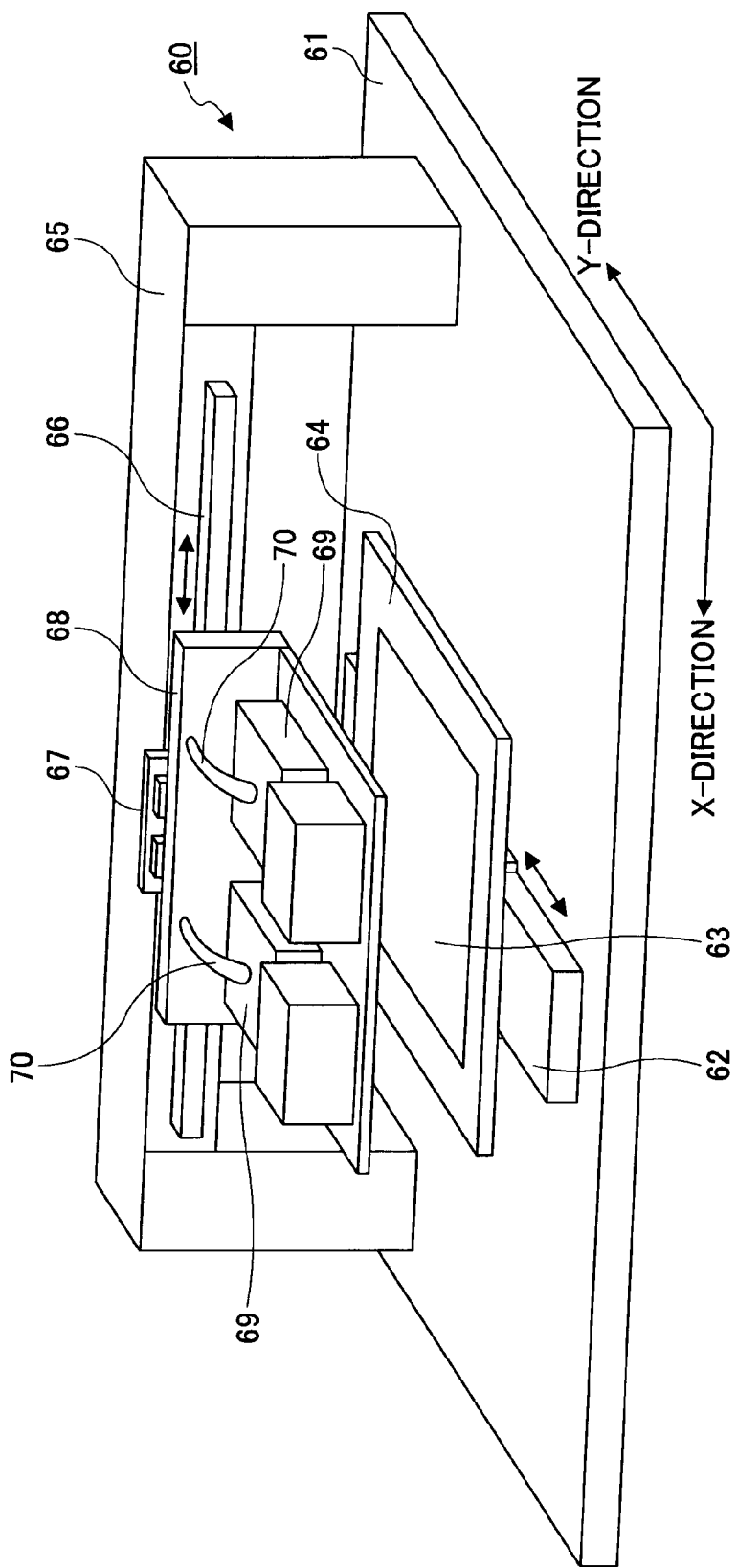
FIG. 7 is a perspective view illustrating an ink-jet coating apparatus.

FIG. 7 is a perceptive view illustrating the ink-jet coating apparatus. In the ink-jet coating apparatus 60 shown in FIG. 7, a Y-axis driving part 62 is set on a pedestal 61, and a stage 64 on which a substrate 63 is mounted is set in a manner of being able to be driven in a Y-axis direction. It is noted that an attracting part (not shown) using vacuum or static electricity accompanies the stage, and therewith, the substrate 63 is fixed thereto. It is noted that the ink-jet coating apparatus 60 is a typical example of a liquid droplet discharging apparatus.

Further, an X-axis driving part 66 is mounted on an X-axis supporting member 65, a head base 68 mounted onto a Z-axis driving part is mounted thereon, and thus, moving in an X-axis is made possible. An ink-jet head 69 discharging ink is mounted onto the head base 68. To the ink-jet head 69, ink is supplied from each ink tank via a respective coloring resin ink supply pipe 70. It is noted that the ink-jet head 69 is a typical example of a liquid droplet discharging head.

A film thickness obtained from one time of a film forming process is preferably around 100 nm, and the concentration of the precursor is made to be an appropriate amount determined from a relationship between a film forming area and a precursor coating amount. The above-mentioned FIG. 6A, (e) shows a state where coating was carried out by the ink-jet coating apparatus, and the precursor spreads on only the hydrophilic part to form a pattern due to the contrast of the contact angles. This was made to undergo 120° C. treatment as first heating (solvent drying), and after that, thermal decomposition of organic matter (500° C.) was carried out. Thus, the state of FIG. 6A, (f) was obtained. At this time, the film thickness was 90 nm.

Subsequently, as the repetitive surface treatment, dip treatment with alkanethiol was carried out, and thus, the patterned SAM film was formed. After the SAM process, the contact angle for water on the platinum film was 92.2°. In contrast thereto, the contact angle for water on the PZT film formed by the ink-jet method was 15°. Thereby, it was confirmed that contrast between the hydrophilic surface and the water repellent surface was sufficient for forming the film by the ink-jet method repetitively for the second and further subsequent layers.

The above-mentioned process was repeated six times, and a film of 540 nm was obtained. After that, crystallization heat treatment (700° C.) was carried out by RTA (Rapid Thermal Annealing). No defect such as a crack occurred in the film. Furthermore, SAM film process→selective coating of the PZT precursor→drying at 120° C.→thermal decomposition at 500° C. were carried out six times, and then, the crystallization process was carried out. No defect such as a crack occurred in the film. The film thickness amounted to 1000 nm.

Next, a SrRuO film (film thickness: 200 nm) as the third electrode 16 was formed by sputtering. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 1 and 2A was formed using an ICP etching apparatus made by SAMCO Inc. Thus, the electromechanical transducing device 10 was produced.

Next, as the insulation protection film 21, a parylene film (film thickness: 2 μm) was formed by CVD. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 3A and 3B was formed using RIE (made by SAMCO Inc.).

Finally, as the fourth electrode 22 and the fifth electrodes 23, an Al film (film thickness: 5 μm) was formed by sputtering. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 3A and 3B was formed using RIE (made by SAMCO Inc.). Thus, the electromechanical transducing device 20 was produced.

Embodiment 2

Up to the forming of the first electrode 13, the processes the same as those of the embodiment 1 were carried out. After that, as surface treatment of the first electrode 13, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. After that, a film of photoresist (TSMR8800) made by Tokyo Ohka Kogyo Co., Ltd. was formed by a spin coating method. Then, a resist pattern was formed by regular photolithography. After that, oxygen plasma treatment was carried out and thus the SAM film at the exposed area was removed. The residual resist after the treatment was removed by dissolution using acetone. Then, when contact angle evaluation was carried out, 46.2° was obtained at the removed part, and the value of 104.3° was obtained at the part covered by the resist. Thus, it was confirmed that patterning of the SAM film was carried out.

Next, a film of LaNiO was formed by an ink-jet method as the second electrode 14. For synthesizing the precursor coated liquid, lanthanum isopropoxide and bis(acetylacetonate)nickel(II) (dihydrate) were used as starting materials. After a dehydration process of bis(acetylacetonate)nickel(II) (dihydrate) was carried out, lanthanum isopropoxide and bis (acetylacetonate)nickel(II)(dihydrate) were dissolved into methoxyethanol, and alcohol exchange reaction and esterification reaction were proceeded with. Thus, a LaNiO precursor solution was synthesized, and the concentration thereof was set to be 0.3 moles/l.

This liquid was coated on the hydrophilic area by using the ink-jet coating apparatus 60 as in the embodiment 1. Due to the contrast of contact angles, the precursor solution spread on only the hydrophilic area, and formed a pattern. This was made to undergo 150° C. treatment as first heating (solvent drying), heat treatment was carried out for one hour at 400° C. at a rate of temperature rise (10° C./min) in oxygen atmosphere, and finally, crystallization heat treatment (temperature: 700° C.) was carried out by RTA (Rapid Thermal Annealing). At this time, the film thickness was 80 nm. Subsequently, as the repetitive process, the SAM film was formed by the same dip treatment after cleaning by isopropyl alcohol. The above-mentioned process was repeated 3 times, and a film of 240 nm was obtained. No defect such as a crack occurred in the film.

Next, in the same method as that in the embodiment 1, the SAM process of the lower layer was carried out, and after that the electromechanical transducing film 15 was produced by an ink-jet method. Next, the SAM process of the lower layer was carried out by the same method as that of the second electrode 14, and after that, LaNiO was formed as the third electrode 16 by an ink-jet method, and the electromechanical transducing device 10 was produced.

Next, as the insulation protection film 21, a $SiO_2$ film (film thickness: 2 μm) was formed by CVD.

After that, a film of photoresist (TSMR8800) made by Tokyo Ohka Kogyo Co., Ltd. was formed by a spin coating method. Then, a resist pattern was formed by regular photolithography. After that, a pattern shown in FIGS. 3A and 3B was formed using RIE (made by SAMCO Inc.).

Next, after the SAM process of the lower layer was carried out, a desired pattern was printed by the ink-jet coating apparatus 60 using an AgPd ink on the market. After that, heat treatment at 300° C. was carried out, the fourth electrode 22 and the fifth electrodes 23 were formed, and thus the electromechanical transducing device 20 was produced.

Embodiment 3

Up to the forming of the pattern after the forming the second electrode 14, the same processes as those of the embodiment 1 were carried out. Then, as surface treatment of the first electrode 13, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. After that, as surface treatment of the second electrode 14, a silane compound (Chemical Formula 1 below) was used, dipping into a solution of a concentration of 0.01 moles/l (solvent: isopropyl alcohol) was carried out, then cleaning using isopropyl alcohol and drying was carried out, and thus, the SAM process was carried out.

Chemical Formula 1

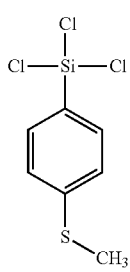

The contact angle for water on the platinum film after the SAM process was 92.2°. In contrast thereto, the contact angle for water on the SrRuO film was equal to or less than 5°. Thereby, it was confirmed that contrast between the hydrophilic surface and the water repellent surface was sufficient for when the electromechanical transducing film 15 was thereafter produced by an ink-jet method.

Next, in the same producing method as that for the embodiment 1, the electromechanical transducing film 15 was produced by the ink-jet method. At this time, in producing the film for each of the second and further subsequent layers of the electromechanical transducing film 15, the alkanethiol for surface treatment of the first electrode 13 and the silane compound for surface treatment of the electromechanical transducing film were used, the SAM processes of the lower layers were carried out, and after that the ink-jet method was used to produce the layer. The insulation protection film 21, the fourth electrode 22 and the fifth electrodes 23 were produced in the same way as that of the embodiment 1. Thus, the electromechanical transducing device 20 was produced.

Comparison Example 1

Up to the forming of the first electrode 13, the processes the same as those of the embodiment 1 were carried out. After that, as surface treatment of the first electrode 13, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. After that, a film of photoresist (TSMR8800) made by Tokyo Ohka Kogyo Co., Ltd. was formed by a spin coating method. Then, a resist pattern was formed by regular photolithography. After that, oxygen plasma treatment was carried out and thus the SAM film at the exposed area was removed. The residual resist after the treatment was removed by dissolution using acetone. Then, when contact angle evaluation was carried out, 46.2° was obtained at the removed part, and the value of 104.3° was obtained at the part covered by the resist. Thus, it was confirmed that patterning of the SAM film was carried out.

Next, in the same producing method as that for the embodiment 1, the electromechanical transducing film 15 was produced by the ink-jet method after the SAM process of the lower layer was carried out. Next, as the third electrode 16, a Pt film (film thickness: 200 nm) was formed by sputtering. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 3A and 3B was formed using an ICP etching apparatus (made by SAMCO Inc.). The insulation protection film 21, the fourth electrode 22 and the fifth electrodes 23 were produced in the same way as that of the embodiment 1. Thus, the electromechanical transducing device 20 was produced.

Comparison Example 2

Up to the forming of the second electrode 14, the processes the same as those of the embodiment 1 were carried out. After that, as surface treatment of the second electrode 14, $CH_3(CH_2)_7$—$SiCl_3$ was used as the silane compound, dipping into a solution of a concentration of 0.01 moles/l (solvent: isopropyl alcohol) was carried out, then cleaning using isopropyl alcohol and drying was carried out, and thus, the SAM process was carried out. After that, a film of photoresist (TSMR8800) made by Tokyo Ohka Kogyo Co., Ltd. was formed by a spin coating method. Then, a resist pattern was formed by regular photolithography. After that, oxygen plasma treatment was carried out and thus the SAM film at the exposed area was removed. The residual resist after the treatment was removed by dissolution using acetone. Then, when contact angle evaluation was carried out, 46.2° was obtained at the removed part, and the value of 104.3° was obtained at the part covered by the resist. Thus, it was confirmed that patterning of the SAM film was carried out.

Next, the electromechanical transducing film 15 was produced by an ink-jet method. At this time, since the silane compound was removed after 500° C. baking at a time of producing the first layer, the same SAM process was carried out and thus the patterning of the SAM film was carried out before producing the second layer of the electromechanical transducing film 15, and after that, the second layer of the electromechanical transducing film 15 was produced by the ink-jet method. The third electrode 16, the insulation protection film 21, the fourth electrode 22 and the fifth electrodes 23 were produced in the same way as that of the embodiment 1. Thus, the electromechanical transducing device 20 was produced.

Evaluation of Embodiment 1-3 and Comparison Examples 1, 2

Evaluation of electric characteristics and electromechanical transducing performance (piezoelectric constant) were carried out using the electromechanical transducing devices produced in the embodiments 1-3 and the comparison examples 1, 2, and the result is shown in Table 1 below:

TABLE 1

| | INITIAL CHARACTERISTICS | | | | | AFTER $10^{10}$ TIMES | |
|---|---|---|---|---|---|---|---|
| | DIELECTRIC CONSTANT $\in$r | DIELECTRIC LOSS tan δ | RESIDUAL DIELECTRIC POLARIZATION Pr | COERCIVE ELECTRIC FIELD Ec | PIEZO-ELECTRIC CONSTANT d31 | RESIDUAL DIELECTRIC POLARIZATION Pr | PIEZO-ELECTRIC CONSTANT d31 |
| EMBODIMENT 1 | 1200 | 0.022 | 25 | 40 | −150 | 24 | −143 |
| EMBODIMENT 2 | 1150 | 0.018 | 22 | 38 | −145 | 21 | −138 |
| EMBODIMENT 3 | 1215 | 0.019 | 21 | 42 | −140 | 20 | −133 |
| COMPARISON EXAMPLE 1 | 1182 | 0.021 | 22 | 41 | −152 | 21 | −62 |
| COMPARISON EXAMPLE 2 | 1243 | 0.023 | 24 | 43 | −147 | 10 | −60 |

Figure 8:
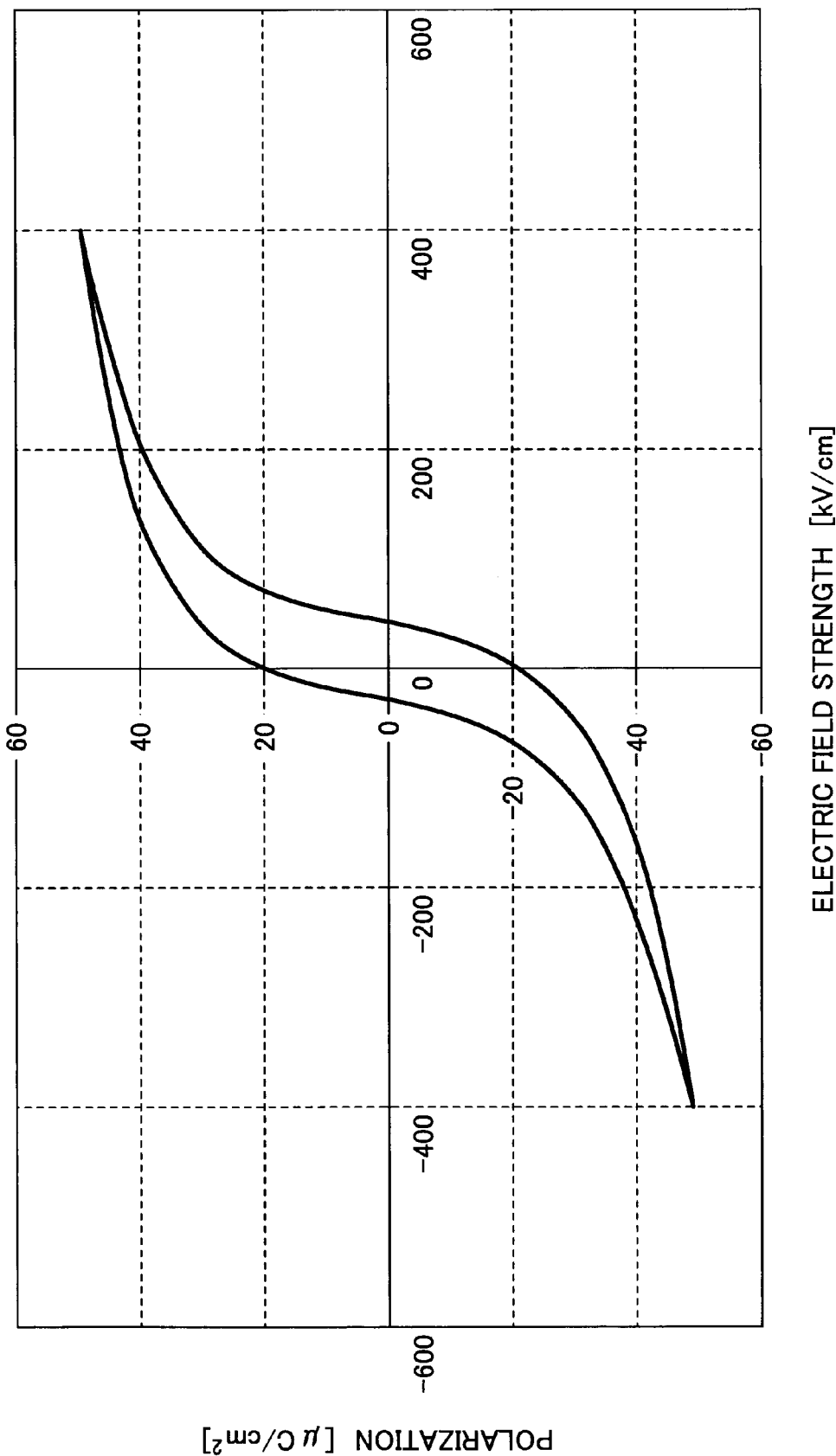
FIG. 8 is a characteristic diagram showing a typical hysteresis curve of electric field strength and polarization.

As shown in Table 1, initially, for any one of the embodiments 1-3 and the comparison examples 1, 2, dielectric constant $\in$r was around 1200; dielectric loss tan δ was around 0.02; residual dielectric polarization Pr was on the order of 20 through 25 μC/cm$^2$; and coercive electric field Ec was on the order of 40 through 50 kV/cm. Thus, the characteristics were equal to ordinary ceramic sintered compacts. It is noted that FIG. 8 is a characteristic diagram showing typical hysteresis curves of electric field strength and polarization.

As to the electromechanical transducing performance, a deforming amount caused by an applied electric field was measured by a laser Doppler vibration meter, and calculation was carried out based on comparison using simulation. Piezoelectric constant d31 was −140 through −160 pm/V for any one of the embodiments 1-3 and the comparison examples 1, 2. Also these values were equal to the ordinary ceramic sintered compacts. These values are those which can be sufficiently used for designing liquid droplet discharging heads. Thus, as to the initial characteristics, there are no large differences between the embodiments 1-3 and the comparison examples 1, 2. However, as to durability (characteristics immediately after applied voltage was applied repetitively $10^{10}$ times), especially piezoelectric constant d31 was considerably degraded for the comparison examples 1 and 2.

[Evaluation of Discharging by Liquid Droplet Head]

Next, the liquid droplet discharging heads 50 of FIG. 5 were produced using the electromechanical transducing devices produced in the embodiments 1-3 and the comparison examples 1, 2, and evaluation of discharging liquid droplets was carried out. An ink in which viscosity was adjusted to 5 cp was used, and discharging states were checked when applied voltages of −10 through −30 V were applied. As a result, other than the comparison example 2, it was confirmed that discharging could be carried out from any nozzle hole.

As to the comparison example 2, depending on a place of the nozzle, discharging varied and was unstable. There was a place where the adjacent electromechanical transducing films came into contact with one another due to insufficiency of accuracy in repetitive alignment when the patterned SAM film was repetitively produced during the process of producing the electromechanical transducing film. On the other hand, with regard to any one of the embodiments 1-3 and the comparison example 1, such a place where the adjacent electromechanical transducing films came into contact with one another as in the comparison example 2 was not found.

Thus, it has been confirmed that the embodiments 1-3 had the considerable difference in the durability (characteristics immediately after applied voltage was applied repetitively $10^{10}$ times) in comparison to the comparison examples 1 and 2. In other words, it has been confirmed that the electromechanical transducing devices produced in the embodiments 1-3 provided the stable ink droplet discharging characteristics including the durability. It is noted that the reason why the satisfactory result could not be obtained from the comparison example 1 seems that the second electrode 14 made of the electrically conductive oxide was not produced on the first electrode 13 made of the metal. Further, the reason why the satisfactory result could not be obtained from the comparison example 2 seems that the area other than the area where the electromechanical transducing film 15 was formed was not be made to be hydrophobic (water repellent).

Figure 9:
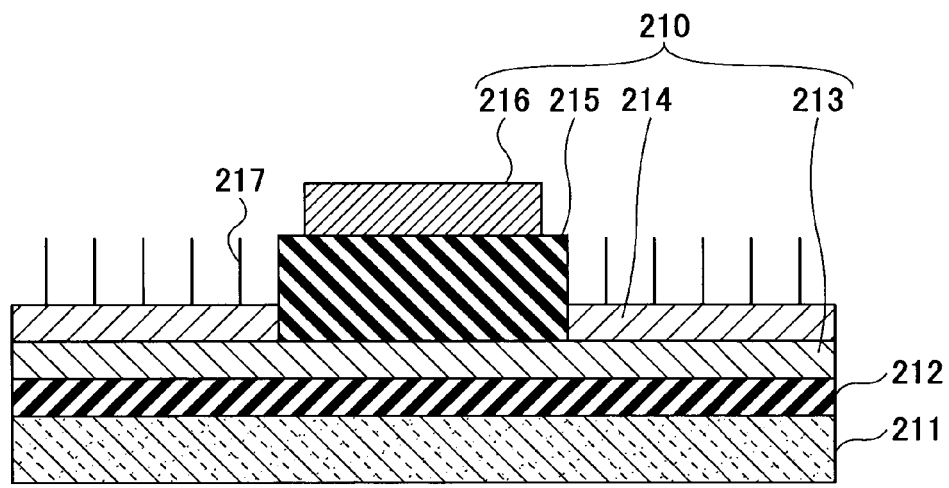
FIG. 9 is a sectional view illustrating an electromechanical transducing device according to a second mode for carrying out the present invention.

FIG. 9 is a sectional view illustrating an electromechanical transducing device according to the second mode for carrying out the present invention. As shown in FIG. 9, the electromechanical transducing device 210 includes a first electrode 213, a second electrode 214, an electromechanical transducing film 215, and a third electrode 216. The electromechanical transducing device 210 is formed on a substrate 211 via a vibration plate 212. In the electromechanical transducing device 210, the first electrode 213 and the third electrode 215 are oxide electrodes. The second electrode 214 is a metal electrode. A SAM (Self Assembled Monolayer) film 217 (hereinafter referred to as SAM film 217) made of alkanethiol or such adheres to a surface of the second electrode 214.

Figure 10A:
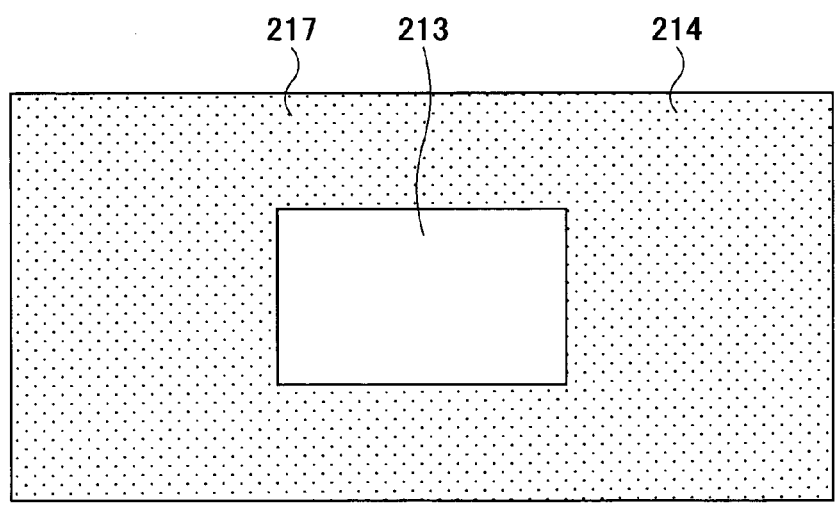
FIGS. 10A and 10B are plan views illustrating a manufacturing method of the electromechanical transducing device according to the second mode for carrying out the present invention.
Figure 10B:
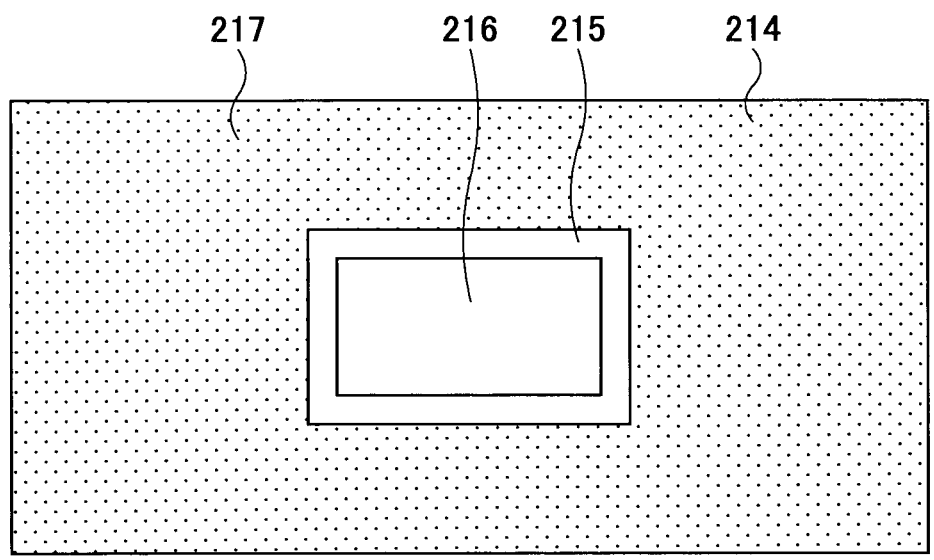

FIGS. 10A and 10B are plan view illustrating a manufacturing method of the electromechanical transducing device according to the second mode for carrying out the present invention. With reference FIGS. 10A and 10B, a manufacturing method of the electromechanical transducing device 210 will now be briefly described.

First, previously, on the substrate 211, the vibration plate 212, the first electrode 213 and the second electrode 214 are laminated in the stated order, and the second electrode 14 is processed to have a desired pattern. Next, as shown in FIG. 10A, a SAM material such as alkanethiol is used, and dip treatment is carried out. Thus, the SAM film 217 of a thiol material or such reacts to and adheres to the surface of the second electrode 214 made of the metal. Thereby, the surface state of the second electrode 214 can be made to have water repellency. Further, the SAM material such as a thiol material does not react to the surface of the first electrode 213 made of the oxide, the SAM film 17 does not adhere thereto, and the surface state of the first electrode 13 is hydrophilic. Thus, before the electromechanical transducing film 15 is produced, the second electrode 214 is previously processed to have the predetermined pattern. Thus, only by the dip treatment with the SAM material such as alkanethiol, partial property modification can be carried out for the hydrophilic part and the hydrophobic part in a self alignment manner. Therefore, it is possible to remarkably shorten the tact time of producing the electromechanical transducing film 215.

Next, as shown in FIG. 10B, the electromechanical transducing film 215 and the third electrode 216 are laminated in the stated order on the first electrode 213 to project from the second electrode 214. Here, in order to produce the electromechanical transducing film 215 to have a film thickness of several micrometers (μm), it is necessary to produce the electromechanical transducing film 215 by laminating several layers by, for example, an ink-jet method. In a case where PZT is used as a material of the electromechanical transducing film 215, 400° C. or more is required as a heat treatment temperature, and thus, the SAM film 217 made of an alkanethiol material or such is removed during the heat treatment. Therefore, after the first layer of PZT is formed on the first electrode 213 and, before each of the second and further subsequent layers of PZT is formed after the heat treatment is carried out, it is necessary to carry out dip treatment the same as that of FIG. 10A.

Specifically, as described above in detail with reference to FIGS. 6A and 6B for the first mode of carrying out the present invention, also in a case where each of the second and further subsequent layers is laminated after the heat treatment, partial property modification for the hydrophilic part and the hydrophobic part can be carried out in a self-alignment manner only by dip treatment with a SAM material such as alkanethiol material or such.

Further, it is also possible that after the dip treatment is carried out using the alkanethiol material and only the surface of the second electrode 214 made of the metal is made to undergo the dip treatment, dip treatment is carried out using organic silane in the same way and thus only the surface of the first electrode 213 made of the oxide is made to undergo surface treatment. It is possible to carry out surface treatment of only the surface of the first electrode 213 made of the oxide since the organic silane material does not react to a metal surface. By using the organic silane material having a group having a high hydrophilic nature, it is possible to further give a contrast ratio between the hydrophilic part and the hydrophobic part on the surface. This is further advantageous for when the electromechanical transducing film 15 is produced by an ink-jet method.

Thus, even in a case where PZT is used as a material of the electromechanical transducing film 215, it is possible to avoid diffusion of Pb by using the oxide electrode as the first electrode 213 and the third electrode 216. Further, by using the metal electrode having sufficiently low specific resistance as the second electrode 214, it is possible to supply a sufficient electric current to the common electrode when voltage driving is carried out. Thus, it is possible to obtain sufficient displacement without a variation between devices (elements) in a case where many piezoelectric elements are driven simultaneously. As a result, it is possible to achieve the electromechanical transducing device 210 where it is possible to obtain stable ink discharging characteristics.

Figure 11A:
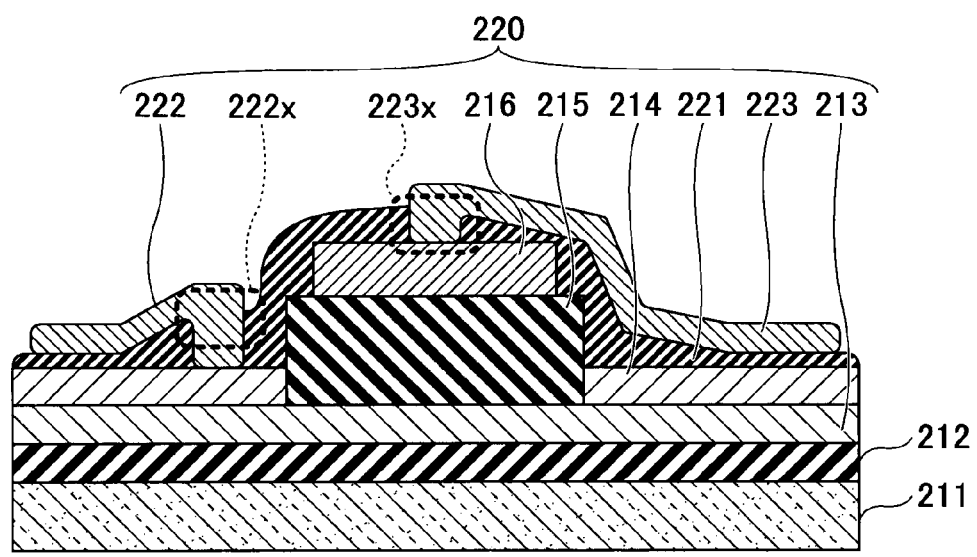
FIG. 11A is a sectional view showing another example of the electromechanical transducing device according to the second mode for carrying out the present invention.
Figure 11B:
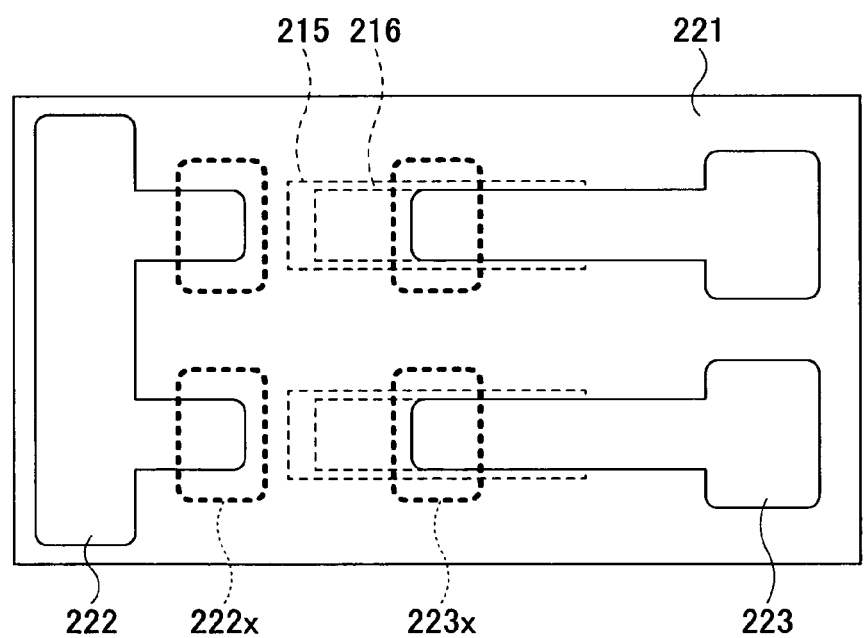
FIG. 11B is a plan view showing the other example of the electromechanical transducing device according to the second mode for carrying out the present invention.

FIG. 11A is a sectional view illustrating another example of the electromechanical transducing device according to the second mode for carrying out the present invention. FIG. 11B is a plan view illustrating the other example of the electromechanical transducing device according to the second mode for carrying out the present invention. As shown in FIGS. 11A and 11B, the electromechanical transducing device 220 has a first electrode 213, a second electrode 214, electromechanical transducing films 215, third electrodes 216, an insulation protection film 221, a fourth electrode 222 and fifth electrodes 223. The electromechanical transducing device 220 is formed on a substrate 211 via a vibration plate 212.

The insulation protection film 221 is formed to cover the second electrode 214, the electromechanical transducing films 215 and the third electrodes 216. The fourth electrode 222 is provided on the insulation protection film 221, and is electrically connected with the second electrode 214 via contact holes 222x passing through the insulation protection film 221. The fifth electrodes 223 are provided on the insulation protection film 221, and are electrically connected with the third electrodes 216 via contact holes 223x passing through the insulation protection film 221, respectively. The third electrodes 216 and the fifth electrodes 223 are individual electrodes provided for the respective electromechanical transducing films 215 individually. The first electrode 213, the second electrode 214 and the fourth electrode 222 are common electrodes provided in common for the respective electromechanical transducing films 215.

By providing the insulation protection film 221 as shown in FIGS. 11A and 11B, it is possible to avoid a failure due to electrical short circuit or destruction of the electromechanical transducing film 215 due to moisture, gas or such.

Next, a liquid droplet discharging head using the electromechanical transducing device according to the second mode for carrying out the present invention will be described. FIG. 12 is a sectional view of the liquid droplet discharging head using the electromechanical transducing device according to the second mode for carrying out the present invention. As shown FIG. 12, the liquid droplet discharging head 230 includes the electromechanical transducing device 210, the vibration plate 212, an adhesive layer 235, a pressure chamber substrate 237 that is a Si substrate, and a nozzle plate 239 on which a nozzle 238 is provided. The adhesive layer 235 is provided for the purpose of enhancing adhesion between the first electrode 213 and the vibration plate 212. A pressure chamber 240 is formed by the vibration plate 212, the pressure chamber substrate 237 and the nozzle plate 239. It is noted that a liquid supply part, a flow passage and fluid resistance are omitted in FIG. 12.

Figure 13:
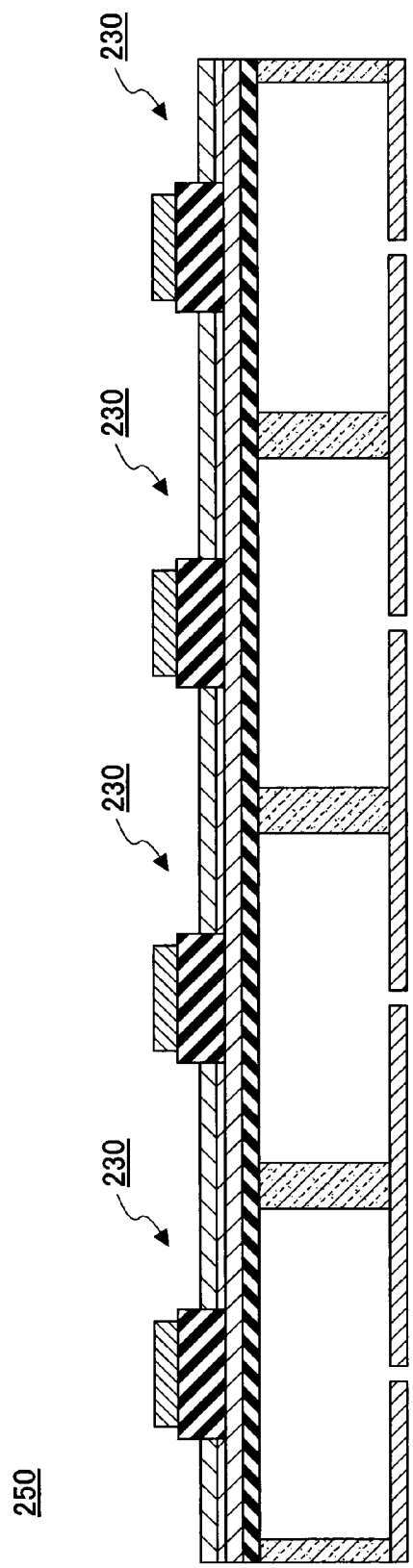
FIG. 13 is a sectional view showing an example in which plural of the liquid droplet discharging heads shown in FIG. 12 are disposed.

FIG. 13 is a sectional view showing an example in which plural of the liquid droplet discharging head of FIG. 12 are disposed. The plural electromechanical transducing devices 210 can be formed on a Si substrate via a vibration plate 212 and an adhesive layer 235, so that the plural electromechanical transducing devices 210 have performance equivalent to that of bulk ceramics by simple manufacturing processes. After that, in order to form pressure chambers 240, parts of the Si substrate are removed by etching from the reverse side, and a nozzle plate 239 having nozzles 238 is bonded. Thus, a liquid droplet discharging head 250 can be produced. It is noted that a liquid supply part, flow passages and fluid resistance are omitted in FIG. 13.

Next, the respective parts shown in FIGS. 9, 10A, 10B, 11A, 11B and so forth will be described in detail.

[Substrate 211]

As the substrate 211, it is preferable to use a silicon single-crystal substrate, and it is preferable to have a thickness of regularly 100 through 600 μm. As to a plane direction, there are three types, i.e., (100), (110) and (111), and generally in semiconductor industry, (100) and (111) are widely used. In the second mode for carrying out the present invention, mostly a silicon single-crystal substrate having a plane direction of (100) is used. Further, in a case where a pressure chamber 240 such as that shown in FIG. 12, is produced, etching is used and a silicon single-crystal substrate is processed. As a method of etching in this case, it is possible to use anisotropic etching.

The anisotropic etching uses a nature that an etching rate is different with respect to a plane direction of a crystal structure. For example, in anisotropic etching in which an alkaline solution such as KOH is use for dip treatment, an etching rate in plane (111) is on the order of 1/400 in comparison to an etching rate in plane (100). Therefore, in contrast to a structure having an inclination of approximately 54° being able to be produced in plane (100), a deep groove can be formed in plane (110), and thus, it is possible to increase an arrangement density with maintaining rigidity. In the second mode for carrying out the present invention, it is also possible to use a silicon single-crystal substrate having a plane direction of (110). However, in this case, attention is required to a fact that $SiO_2$ that is a mask material is also etched.

[Vibration Plate 212]

In the liquid droplet discharging head 230 shown in FIG. 12, the vibration plate 212 acting as the lower layer of the electromechanical transducing film 215 receives force generated by the electromechanical transducing film 215, is deformed and displaced, and thus causes an ink droplet to be discharged from the pressure chamber 240. Therefore, the vibration plate 212 preferably has predetermined strength. As the vibration plate 212, it is possible to use one produced by a CVD method using a material such as Si, $SiO_2$ or $Si_3N_4$. Further, as a material of the vibration plate 212, it is preferable to use a material having a coefficient of linear expansion close to that of the first electrode 213 and/or the electromechanical transducing film 215.

Especially, in many cases, PZT is used as a material of the electromechanical transducing film 215, and therefore, a material having a coefficient of linear expansion of $5 \times 10^{-6}$ through $10 \times 10^{-6}$ (1/K) close to the coefficient of linear expansion of $8 \times 10^{-6}$ (1/K) of PZT is preferable as the material of the vibration plate 212. Further, a material having a coefficient of linear expansion of $7 \times 10^{-6}$ through $9 \times 10^{-6}$ (1/K) is more preferable as the material of the vibration plate 212.

As a specific material of the vibration plate 212, aluminium oxide, zirconium oxide, iridium oxide, ruthenium oxide, tantalum oxide, hafnium oxide, osmium oxide, rhenium oxide, rhodium oxide, palladium oxide, a compound thereof or such may be used. Using any one of them, it is possible to produce the vibration plate 212 with a spin coater by a sputtering method or a sol-gel process.

As a film thickness of the vibration plate 212, 0.1 through 10 μm is preferable, and 0.5 through 3 μm is more preferable. When the film thickness is smaller than the range, it is difficult to carry out processing to produce the pressure chamber 240 such as that shown in FIG. 12. When the film thickness is larger than the range, the vibration plate 212 is not easily deformed and displaced, and discharging an ink drop may become unstable.

[First Electrode 213]

In a case where a complex oxide including lead is used as the electromechanical transducing film 215, there may be a case where reaction of lead included in the electromechanical transducing film 215 to the first electrode 213 or diffusion of the lead occurs and piezoelectric characteristics are degraded. Therefore, as a material of the first electrode 13, an electrode material having a barrier property with respect to reaction to lead/diffusion of lead is required.

As a material of the first electrode 213, using an electrically conductive oxide is effective. As a specific material of the first electrode 213, a complex oxide described as a chemical formula of $ABO_3$ and containing, as main constituents, A=Sr, Ba, Ca or La and B=Ru, CO or Ni, i.e., $SrRuO_3$, $CaRuO_3$, a solid solution thereof, i.e., $(Sr1-x\ Cax)O_3$, $LaNiO_3$, $SrCOO_3$, or a solid solution thereof, i.e., $(La, Sr) (Ni1-y\ COy)O_3$ (y may be 1), may be listed. As another oxide material, $IrO_2$ or $RuO_2$ may also be listed. In other words, a material of the first electrode 213 may be a complex oxide described by the chemical formula of $ABO_3$, containing as main constituents, A which includes any one or more of Sr, Ba, Ca and La, and B which includes any one or more of Bu, Co and Ni, or an oxide being any one of $IrO_2$ and $RuO_2$.

As a manufacturing method of the first electrode 213, it is possible to produce it with a spin coater by a sputtering method or a sol-gel process.

[Second Electrode 214]

As a metal material to be used for the second electrode 214, for example, platinum having high heat resistance and low reactivity may be used. However, some case, platinum does not have a sufficient barrier property against lead. Therefore, it is preferable to use a platinum group element such as iridium or platinum-rhodium, or an alloy film thereof. Further, platinum does not have satisfactory adhesion with the first electrode 213 (electrically conductive oxide) as the lower layer of the second electrode 214. Therefore, in a case where platinum is used as a material of the second electrode 214, it is preferable to laminate the adhesive layer 235 first as the lower layer of the second electrode 214, as shown in FIG. 12. As a material of the adhesive layer 235, for example, Ti, $TiO_2$, Ta, $Ta_2O_5$, $Ta_3N_5$ or such may be used. As a method of producing the second electrode 214, a sputtering method or a vacuum evaporation method may be used. As a film thickness of the second electrode 214, 0.05 through 1 μm is preferable, and 0.1 through 0.5 μm is more preferable.

After the film of the second electrode 214 is formed, a desired pattern thereof is obtained by photolithoetching or such. As another method, the area on the first electrode 213 as the lower layer other than the area on which the second electrode 214 is to be formed may be made to undergo surface modification to have water repellency; and the second electrode 214 may be formed using an ink-jet method on the area which is to form the second electrode 214 and is not made to have the water repellency but rather has a hydrophilic nature. It is noted that the area to form the second electrode 214 is an area to which the patterned second electrode 214 is to be formed.

Figure 14:
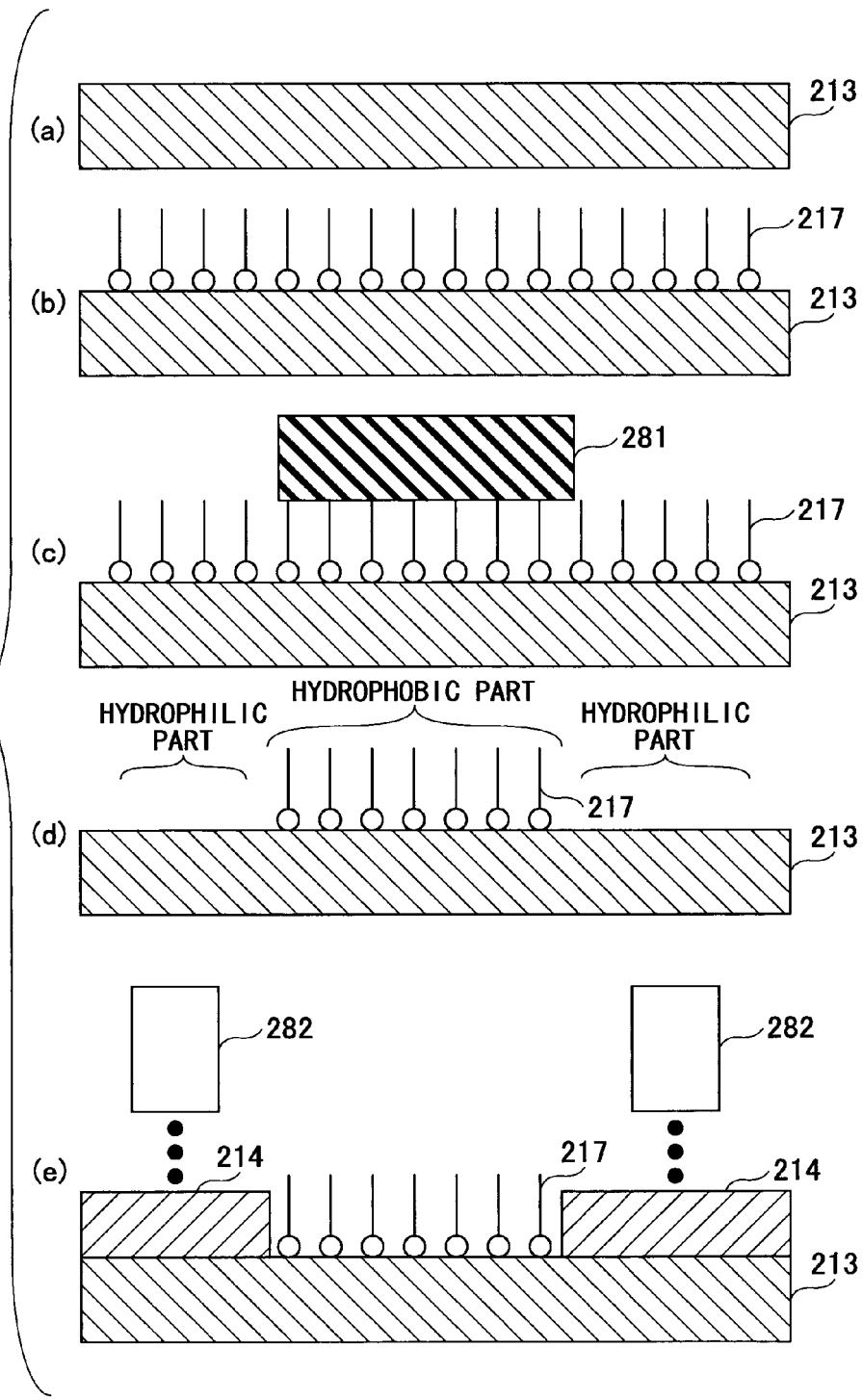
FIG. 14 is sectional views illustrating detailed processes of an ink-jet method according to the second mode for carrying out the present invention.

Specifically, first, as shown in FIG. 14, (a), the first electrode 213 to act as the lower layer is prepared. Then, as shown in FIG. 14, (b), a SAM film 217 (Self Assembled Monolayer) is coated on the entire surface of the first electrode 213. As the SAM film 217, although it is different depending on the material of the lower layer, mostly an organic silane compound, phosphonic acid, phosphate ester or carboxylic acid is selected in a case where an oxide is used as the lower layer. Although reactivity and/or hydrophobic (water repellent) nature is different depending on the molecule chain length, molecules of C6 through C18 are dissolved into a common organic solvent (alcohol, acetone or toluene) (concentration: several moles/l). Using the solution, the entire surface coating process is carried out by any one of a dip treatment, vapor, a spin coater and so forth, extra molecules are replaced and cleaned with the solvent, and drying is carried out. Thus, the SAM film 217 can be formed on the surface of the first electrode 213.

Next, as shown in FIG. 14, (c), a pattern of a photoresist 281 is formed by photolithography. Next, as shown in FIG. 14, (d), by dry etching, the part of the SAM film 217 not covered by the photoresist 281 is removed. Further, the photoresist 281 is removed. Thus, patterning of the SAM film 217 is finished.

Next, as shown in FIG. 14, (e), a liquid discharging head 282 is used to coat liquid droplets (ink). Thus, the coated film is not formed on the SAM film 217 that is the hydrophobic part, and a patterned coated film 214a is formed on only the hydrophilic part from which the SAM film 217 is removed.

After that, heat treatment is carried out. Thus, the second electrode 214 patterned by the ink-jet method is obtained. As to the ink, a nano silver ink on the market, for example, may be used. However, it is not necessary to limit thereto. Further, it is preferable to use an ink material having heat resistance for 500° C. or more since thermal history of 500° C. or more is applied in the subsequent process.

[Electromechanical Transducing Film 215]

According to the second mode for carrying out the present invention, as a material of the electromechanical transducing film 215, mostly PZT is used. PZT is a solid solution of lead zirconate ($PbZrO_3$) and lead titanate ($PbTiO_3$), and has characteristics that are different depending on a ratio thereof. A composition showing superior piezoelectric characteristics has a ratio of 53:47 between $PbZrO_3$ and $PbTiO_3$, is indicated by a chemical formula of $Pb(Zr0.53, Ti0.47)O_3$, and is generally indicated as PZT(53/47). As a complex oxide other than PZT, barium titanate or such may be used. In this case, a barium alkoxide and titanium alkoxide compound may be used as a starting material, it may be dissolved into a common solvent, and thus, a barium titanate precursor solution may be produced.

These materials are described by a general formula $ABO_3$, and a complex oxide containing, as main constituents, A=Pb, Ba or Sr and B=Ti, Zr, Sn, Ni, Zn, Mg or Nb, corresponds thereto. Specific descriptions thereof include $(Pb1-x, Ba)(Zr, Ti)O_3$ and $(Pb1-x, Sr)(Zr, Ti)O_3$ in a case where Ba or Sr is used to substitute for part of Pb on A site. Such a substitution may be carried out by using a divalent element, and an advantageous effect thereof is to reduce degradation in characteristics occurring due to evaporation of lead during heat treatment.

As a method of producing the electromechanical transducing film 215, it is possible to produce it by a sputtering method or a sol-gel process using a spin coater. In this case, patterning is required. Therefore, a desired pattern is obtained by photolithoetching or such. In a case where PZT is produced by a sol-gel process, it is possible to produce a PZT precursor solution by using a lead acetate, zirconium alkoxide and titanium alkoxide compound as a starting material, dissolving it using methoxyethanol as a common solvent, and obtaining a uniform solution. Since a metal alkoxide compound is easily hydrolyzed by moisture in the atmosphere, acetylacetone, acetic acid, diethanolamine or such may be added to the precursor solution as a stabilizer by an appropriate amount.

In a case of obtaining a PZT film on the entire surface of the lower substrate, it is possible to obtain it by forming a coated film by a solution coating method such as spin coating, and carrying out respective heat treatments of drying solvent, thermal decomposition and crystallization. Since volume shrinkage occurs along with transformation from the coated film into the crystallized film, adjustment of the precursor concentration is required so that a film thickness of equal to or less than 100 nm can be obtained through one time of the process, in order to obtain a crack-free film.

Further, when the electromechanical transducing film 215 is obtained by an ink-jet method, it is possible to obtain a patterned film by the same flow as the flow (see FIGS. 6A and 6B) for the second electrode 14 of the first mode for carrying out the present invention. As to the surface modification material, although it is different depending on the material of the lower layer, mostly a silane compound is selected in a case where an oxide is used as the lower layer, and mostly alkanethiol is selected in a case where a metal is used as the lower layer.

As a film thickness of the electromechanical transducing film 215, 0.5 through 5 μm is preferable, and 1 through 2 μm is more preferable. When the film thickness is smaller than the range, it may not be possible to generate sufficient displacement. When the film thickness is larger than the range, the number of processes for laminating layers is increased, and the process time period is made longer.

[Third Electrode 216]

As a material of the third electrode 216, it is advantageous to use an electrically conductive oxide, the same as for the first electrode 213. As a specific material of the third electrode 16, a complex oxide described as a chemical formula of $ABO_3$ and containing, as main constituents, A=Sr, Ba, Ca or La and B=Ru, CO or Ni, i.e., $SrRuO_3$, $CaRuO_3$, a solid solution thereof, i.e., $(Sr1-x Cax)O_3$, $LaNiO_3$, $SrCOO_3$, or a solid solution thereof, i.e., $(La, Sr)(Ni1-y COy)O_3$ (y may be 1), may be listed. As another oxide material, $IrO_2$ or $RuO_2$ may also be listed. Further, it is also advantageous to use, on the electrically conductive oxide, in order to supplement for wiring resistance, a platinum group element such as platinum, iridium or platinum-rhodium, an alloy film thereof, Ag alloy, Cu, Al or Au.

As a method of producing the third electrode 216, it is possible to produce it with a spin coater by a sputtering method or a sol-gel process. In this case, patterning is required, and a desired pattern is obtained by photolithoetching or such. Other than it, it is also possible to produce a patterned film by an ink-jet method using a process of carrying out partial surface modification on the second electrode 214 and the lower layer. For a case where it is produced by an ink-jet method, a patterned film can be obtained by a producing flow the same as that (see FIGS. 6A and 6B) for the second electrode 14 of the first mode for carrying out the present invention.

As a film thickness of the third electrode 216, 0.05 through 1 μm is preferable, and 0.1 through 0.5 μm is more preferable.

[Insulation Protection Film 221]

The insulation protection film 221 is provided for the purpose of avoiding a failure due to electrical short circuit or destruction of the electromechanical transducing film 215 due to moisture, gas or such. As a material of the insulation protection film 221, an inorganic film such as a silicon oxide film, a silicon nitride film or a silicon oxynitride film, or an organic film such as a polyimide or parylene film is preferable. As a film thickness of the insulation protection film 221, 0.5 through 20 μm is preferable, and 1 through 10 μm is more preferable. When the film thickness of the insulation protection film 21 is smaller than the range, the function as the insulation protection film 221 cannot be sufficiently carried out. When the film thickness of the insulation protection film 221 is larger than the range, the process time period becomes longer.

As a method of producing the insulation protection film 221, it is possible to use CVD, a sputtering method, a spin coating method or such. Further, it is necessary to produce contact holes 222x and 223x for electrically connecting the fourth electrode 222 and the fifth electrode 223 with the second electrode 214 and the third electrode 216, respectively. For this purpose, a desired pattern is obtained by photolithoetching or such.

It is also possible to produce the insulation protection film 221 having the contact holes 222x and 223x by one time of a process using a screen printing method. As a paste material used in the screen printing method, it is possible to use one obtained from dissolving resin and inorganic or organic particles into an organic solvent. As the resin, a material containing polyvinyl alcohol resin, polyvinyl acetal resin, acrylic resin, ethyl cellulose resin or such may be used. As the inorganic particles, silica ($SiO_2$), alumina ($Al_2O_3$), titanium oxide ($TiO_2$), zinc oxide (ZnO), barium titanate ($BaTiO_3$) or such may be used. Thereamong, a material having relatively low dielectric constant such as silica, alumina or zinc oxide is preferable.

In a case where a pattern having fineness assumed in the second mode for carrying out the present invention is formed, the insulation protection film 221 is formed by transferring the paste material supplied in a mesh having a line diameter of 15 through 50 μm and an open area ratio of 40 through 60%. Therefore, it is possible to form the insulation protection film 221 together with the contact holes 222x and 223x.

[Fourth Electrode 222, Fifth Electrodes 223]

As a material of the fourth electrode 222 and the fifth electrodes 223, a metal electrode material made of any one of Ag alloy, Cu, Al, Pt and Ir is preferable. The fourth electrode 222 and the fifth electrodes 223 may be produced by, for example, a sputtering method, a spin coating method or such, and after that, a desired pattern may be obtained by photolithoetching or such. Further, it also possible to produce a patterned film by an ink-jet method using a process of carrying out partial surface modification on the surface of the insulation protection film 221 that is the lower layer. In the case of producing them by the ink-jet method, the patterned film can be obtained by a flow the same as that (see FIGS. 6A and 6B) for the second electrode 14 of the first mode for carrying out the present invention.

As the surface modification material, mostly a silane compound is selected in a case where the insulation protection film 221 as the lower layer is an oxide. Further, in a case where the insulation protection film 221 is organic matter such as polyimide (PI), it is possible to increase surface energy of an area where ultraviolet light is irradiated. As a result, it is possible to directly draw a very fine pattern of the fourth electrode 222 and the fifth electrodes 223 at the areas at which the surface energy is increased, by an ink-jet method. As a polymeric material with which surface energy can be increased by ultraviolet light, a material, described in Japanese Laid-Open Patent Application No. 2006-060079, or such, may be used.

Further, it is also possible to obtain electrode films acting as the fourth electrode 222 and the fifth electrodes 223 by a screen printing method using the following paste material on the market: Perfect gold (registered trademark) (a gold paste, a product name of Vacuum Metallurgical Co., Ltd.), OrgacOnPastevariant 1/4, Paste Variant 1/3 (both transparent PEDOT/PSS ink, product names of Agfa-Gevaert Japan), OrgacOnCarbOnPaste variant 2/2 (carbon electrode paste, a product name of Agfa-Gevaert Japan), or BAYTRON (registered trademark) P (PEDT/PSS aqueous solution, a product name of H.C. Stark-V TECH Ltd.).

As a film thickness of the fourth electrode 222 and the fifth electrodes 223, 0.1 through 20 μm is preferable, and 0.2 through 10 μm is more preferable. When the film thickness of the fourth electrode 222 and the fifth electrodes 223 is smaller than the range, the resistance becomes larger, and it is not possible to sufficiently flow electric currents through the electrodes, whereby the discharging from the head becomes unstable. When the film thickness of the fourth electrode 222 and the fifth electrodes 223 is larger than the range, the process time period is elongated.

Below, embodiments of the second mode for carrying out the present invention will be described.

Embodiment 4

A thermal oxide film (film thickness: 1 μm) was formed on a silicon wafer, and an SrRuO film (film thickness: 200 nm) as the first electrode 213 was formed by sputtering. Next, a titanium film (film thickness: 50 nm) as the adhesive layer 235, and subsequently, a platinum film (film thickness: 200 nm) as the second electrode 214 are formed by sputtering. The adhesive layer 235 made of the titanium film acts as a part of improving adhesion between the SrRuO film and the platinum film. After that, a film of photoresist (TSMR8800) made by Tokyo Ohka Kogyo Co., Ltd. was formed by a spin coating method. Then, a resist pattern 281 was formed by regular photolithography. After that, a pattern shown in FIGS. 9 and 10A was formed using an ICP etching apparatus made by SAMCO Inc.

Next, as surface treatment of the second electrode 214, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. The contact angle for water on the platinum film after the SAM process was 92.2°. In contrast thereto, the contact angle for water on the SrRuO film was 15°. Thereby, it was confirmed that contrast between the hydrophilic surface and the water repellent surface was sufficient for when the electromechanical transducing film 215 was thereafter produced by an ink-jet method.

Next, as the electromechanical transducing film 215, a film of PZT (53/47) was formed by an ink-jet method. Synthesizing of the precursor coating liquid was carried out using lead acetate trihydrate, titanium isopropoxide and zirconium isopropoxide were used as starting materials. As to water of crystallization in the lead acetate, dissolving into methoxyethanol was carried out, and then, dehydration was carried out. The amount of lead was made excessive by 10 mole percent with respect to the stoichiometric composition. This is for the purpose of avoiding degradation in crystallinity due to a reduction of lead through heat treatment.

Titanium isopropoxide and zirconium isopropoxide were dissolved into methoxyethanol, alcohol exchange reaction and esterification reaction were proceeded with, and mixing with the methoxyethanol into which the above-mentioned lead acetate was dissolved was carried out. Thus, a PZT precursor solution was synthesized. The PZT concentration thereof was set to be 0.1 moles/l. The PZT precursor solution was coated, by an ink-jet coating apparatus, on the hydrophilic area (an area of the SrRuO film produced as the first electrode 213) obtained from patterning the second electrode 214 (see FIG. 10A) as mentioned above by the photolithoetching.

FIG. 7 is a perceptive view illustrating the ink-jet coating apparatus already described above for the first mode for carrying out the present invention.

A film thickness obtained from one time of a film forming process is preferably around 100 nm, and the concentration of the precursor is made to be an appropriate amount determined from a relationship between a film forming area and a precursor coating amount. The above-mentioned FIG. 6A, (e) (used in the above description of the first mode for carrying out the present invention) shows a state where coating was carried out by the ink-jet coating apparatus, and the precursor spread on only the hydrophilic part to form a pattern due to the contrast of the contact angle. This was made to undergo 120° C. treatment as first heating (solvent drying), and after that, thermal decomposition (500° C.) of organic matter was carried out. Thus, the state of FIG. 6A, (f) was obtained. At this time, the film thickness was 90 nm.

Subsequently, as a repetitive surface treatment, dip treatment by alkanethiol was carried out, and thus, the patterned SAM film was formed. After the SAM process, the contact angle for water on the platinum film was 92.2°. In contrast thereto, the contact angle for water on the PZT film formed by the ink-jet method was 15°. Thereby, it was confirmed that contrast between the hydrophilic surface and the water repellent surface was sufficient for forming the film by the ink-jet method repetitively for the second and further subsequent layers.

The above-mentioned process was repeated six times, and a film of 540 nm was obtained. After that, crystallization heat treatment (700° C.) was carried out by RTA (Rapid Thermal Annealing). No defect such as a crack occurred in the film. Furthermore, SAM film process→selective coating of the PZT precursor→drying at 120° C.→thermal decomposition at 500° C. were carried out six times, and then, the crystallization process was carried out. No defect such as a crack occurred in the film. The film thickness amounted to 1000 nm.

Next, a SrRuO film (film thickness: 200 nm) as the third electrode 216 was formed by sputtering. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 9 and 10A was formed using an ICP etching apparatus made by SAMCO Inc. Thus, the electromechanical transducing device 210 was produced.

Next, as the insulation protection film 221, a parylene film (film thickness: 2 μm) was formed by CVD. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 11A and 11B was formed using RIE (made by SAMCO Inc.).

Finally, as the fourth electrode 222 and the fifth electrodes 223, an Al film (film thickness: 5 μm) was formed by sputtering. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 11A and 11B was formed using RIE (made by SAMCO Inc.). Thus, the electromechanical transducing device 220 was produced.

Embodiment 5

A thermal oxide film (film thickness: 1 μm) was formed on a silicon wafer. Next, a film of LaNiO was formed by a spin coating method as the first electrode 213. For synthesizing of the precursor coating liquid, lanthanum isopropoxide and bis(acetylacetonate)nickel(II)(dihydrate) were used as starting materials. After a dehydration process of bis(acetylacetonate)nickel(II)(dihydrate) was carried out, lanthanum isopropoxide and bis(acetylacetonate)nickel(II)(dihydrate) were dissolved into methoxyethanol, and alcohol exchange reaction and esterification reaction were proceeded with. Thus, the LaNiO precursor solution was synthesized. The LaNiO concentration thereof was set to be 0.3 moles/l.

Next, as surface treatment of the first electrode 13, $CH_3(CH_2)_7$—$SiCl_3$ was used as the silane compound, dipping into a solution of a concentration of 0.01 moles/l (solvent: isopropyl alcohol) was carried out, then cleaning using isopropyl alcohol and drying was carried out, and thus, the SAM process was carried out. After that, a film of photoresist (TSMR8800) made by Tokyo Ohka Kogyo Co., Ltd. was formed by a spin coating method. Then, a resist pattern was formed by regular photolithography. After that, oxygen plasma treatment was carried out and thus the SAM film at the exposed area was removed. The residual resist after the treatment was removed by dissolution using acetone. Then, when contact angle evaluation was carried out, 46.2° was obtained at the removed part, and the value of 104.3° was obtained at the part covered by the resist. Thus, it was confirmed that patterning of the SAM film was carried out.

Next, as the second electrode 214, a nano silver ink on the market was used, and a film was formed by an ink-jet method. The nano silver ink was coated on the hydrophilic area of the first electrode 213 by using the ink-jet coating apparatus 60 as that also used in the embodiment 4. Due to the contrast of contact angle, the silver ink spread on only the hydrophilic area, and formed a pattern. This was made to undergo 150° C. treatment as first heating (solvent drying), and heat treatment was carried out for one hour at 300° C. at a rate of temperature rise (10° C./min) in $N_2$ atmosphere. At this time, the film thickness was 80 nm.

Next, in the same method as that in the embodiment 4, the SAM process of the lower layer was carried out, and after that the electromechanical transducing film 215 was produced by the ink-jet method. Next, as the third electrode 216, a film of LaNiO was produced by an ink-jet method, after the SAM process of the lower layer was carried out, by the same producing method as that for the second electrode 214. The ink used there was obtained based on the material used when producing the first electrode 213.

Next, as the insulation protection film 221, a $SiO_2$ film (film thickness: 2 μm) was formed by CVD. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 11A and 11B was formed using RIE (made by SAMCO Inc.).

Next, after the SAM process of the lower layer was carried out, a desired pattern was printed by the ink-jet coating apparatus 60 using an AgPd ink on the market. After that, heat treatment at 300° C. was carried out, the fourth electrode 222 and the fifth electrodes 223 were formed, and thus the electromechanical transducing device 220 was produced.

Embodiment 6

Up to the forming of the pattern after the forming of the second electrode 214, the same processes as those of the embodiment 4 were carried out. Then, as surface treatment of the second electrode 214, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. After that, as surface treatment of the first electrode 213, a silane compound (Chemical Formula 2, below) was used, dipping into a solution of a concentration of 0.01 moles/l (solvent: isopropyl alcohol) was carried out, then cleaning using isopropyl alcohol and drying was carried out, and thus, the SAM process was carried out.

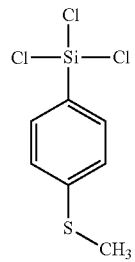

Chemical Formula 2

The contact angle for water on the platinum film after the SAM process was 92.2°. In contrast thereto, the contact angle for water on the SrRuO film was equal to or less than 5°. Thereby, it was confirmed that contrast between the hydrophilic surface and the water repellent surface was sufficient for when the electromechanical transducing film 215 was thereafter produced by an ink-jet method.

Next, in the same producing method as that for the embodiment 4, the electromechanical transducing film 215 was produced by the ink-jet method. At this time, in the producing the film for each the second and further subsequent layers of the electromechanical transducing film 215, alkanethiol for surface treatment of the second electrode 214 and a silane compound for surface treatment of the electromechanical transducing film were used, the SAM processes of the lower layers were carried out, and after that the ink-jet method was used to produce the layer. The insulation protection film 221, the fourth electrode 222 and the fifth electrodes 223 were produced in the same way as that in the embodiment 4. Thus, the electromechanical transducing device 220 was produced.

Comparison Example 3

A thermal oxide film (film thickness: 1 μm) was formed on a silicon wafer, and a titanium film (film thickness: 50 nm) as the adhesive layer 235 and then a platinum film (film thickness: 200 nm) as the first electrode 213 were formed by sputtering. The adhesive layer 235 made of the titanium film acts as a part of improving adhesion between the thermal oxide film and the platinum film. Next, a SrRuO film (film thickness: 200 nm) as the second electrode 214 was formed by sputtering. After that, a film of photoresist (TSMR8800) made by Tokyo Ohka Kogyo Co., Ltd. was formed by a spin coating method. Then, a resist pattern 281 was formed by regular photolithography. After that, a pattern shown in FIGS. 9 and 10A was formed using an ICP etching apparatus made by SAMCO Inc.

Next, as surface treatment of the first electrode 213, $CH_3(CH_2)_6$—SH was used as the alkanethiol, dipping into a solution of a concentration of 0.01 moles/l (solvent: isopropyl alcohol) was carried out, then cleaning using isopropyl alcohol and drying was carried out, and thus, the SAM process was carried out. The contact angle for water on the platinum film after the SAM process was 92.2°. In contrast thereto, the contact angle for water on the SrRuO film was 15°. Thereby, it was confirmed that contrast between the hydrophilic surface and the water repellent surface was sufficient for when the electromechanical transducing film 215 was thereafter produced by an ink-jet method.

Next, in the same producing method as that for the embodiment 4, the electromechanical transducing film 215 was produced by the ink-jet method. Next, as the third electrode 216, a Pt film (film thickness: 200 nm) was formed by sputtering. After that, a film of photoresist (TSMR8800) made by Tokyo Ohka Kogyo Co., Ltd. was formed by a spin coating method. Then, a resist pattern was formed by regular photolithography. After that, a pattern shown in FIGS. 11A and 11B was formed using an ICP etching apparatus (made by SAMCO Inc.). The insulation protection film 221, the fourth electrode 222 and the fifth electrodes 223 were produced in the same way as that of the embodiment 4. Thus, the electromechanical transducing device 220 was produced.

Comparison Example 4

Up to the forming of the first electrode 213, the processes the same as those of the embodiment 4 were carried out. After that, as surface treatment of the first electrode 213, $CH_3(CH_2)_7$—$SiCl_3$ was used as the silane compound, dipping into a solution of a concentration of 0.01 moles/l (solvent: isopropyl alcohol) was carried out, then cleaning using isopropyl alcohol and drying was carried out, and thus, the SAM process was carried out. After that, a film of photoresist (TSMR8800) made by Tokyo Ohka Kogyo Co., Ltd. was formed by a spin coating method. Then, a resist pattern was formed by regular photolithography. After that, oxygen plasma treatment was carried out and thus the SAM film at the exposed area was removed. The residual resist after the treatment was removed by dissolution using acetone. Then, when contact angle evaluation was carried out, 46.2° was obtained at the removed part, and the value of 104.3° was obtained at the part covered by the resist. Thus, it was confirmed that patterning of the SAM film was carried out.

Next, the electromechanical transducing film 215 was produced by an ink-jet method. At this time, since the silane compound was removed after 500° C. baking at a time of producing the first layer, the same SAM process was carried out and thus the patterning of the SAM film was carried out before producing the second layer of the electromechanical transducing film 215. After that, the second layer of the electromechanical transducing film 215 was produced by the ink-jet method. The third electrode 216, the insulation protection film 221, the fourth electrode 222 and the fifth electrodes 223 were produced in the same way as that in the embodiment 4. Thus, the electromechanical transducing device 220 was produced.

Evaluation of Embodiments 4-6 and Comparison Examples 3, 4

Evaluation of electric characteristics and electromechanical transducing performance (piezoelectric constant) were carried out using the electromechanical transducing devices produced in the embodiments 4-6 and the comparison examples 3, 4, and the result is shown in Table 2 below.

TABLE 2

| | INITIAL CHARACTERISTICS | | | | | AFTER $10^{10}$ TIMES | |
|---|---|---|---|---|---|---|---|
| | DIELECTRIC CONSTANT $\in r$ | DIELECTRIC LOSS tan δ | RESIDUAL DIELECTRIC POLARIZATION Pr | COERCIVE ELECTRIC FIELD Ec | PIEZO-ELECTRIC CONSTANT d31 | RESIDUAL DIELECTRIC POLARIZATION Pr | PIEZO-ELECTRIC CONSTANT d31 |
| EMBODIMENT 4 | 1200 | 0.022 | 25 | 40 | −150 | 24 | −143 |
| EMBODIMENT 5 | 1150 | 0.018 | 22 | 38 | −145 | 21 | −138 |
| EMBODIMENT 6 | 1215 | 0.019 | 21 | 42 | −140 | 20 | −133 |
| COMPARISON EXAMPLE 3 | 1182 | 0.021 | 22 | 41 | −152 | 21 | −62 |
| COMPARISON EXAMPLE 4 | 1243 | 0.023 | 24 | 43 | −147 | 10 | −60 |

As shown in Table 2, initially, for any one of the embodiments 4-6 and the comparison examples 3, 4, dielectric constant $\in r$ was around 1200; dielectric loss tan δ was around 0.02; residual dielectric polarization Pr was on the order of 20 through 25 μC/cm$^2$; and coercive electric field Ec was on the order of 40 through 50 kV/cm. Thus, the characteristics were equal to ordinary ceramic sintered compacts. It is noted that FIG. 8 is a characteristic diagram showing typical hysteresis curves of electric field strength and polarization.

As to the electromechanical transducing performance, a deforming amount caused by an applied electric field was measured by a laser Doppler vibration meter, and calculation was carried out based on comparison using simulation. Piezoelectric constant d31 was −140 through −160 pm/V for any one of the embodiments 4-6 and the comparison examples 3, 4. Also these values were equal to ordinary ceramic sintered compacts. These values are those which can be sufficiently used for designing liquid droplet discharging heads. Thus, as to the initial characteristics, there are no large differences between the embodiments 4-6 and the comparison examples 3, 4. However, as to durability (characteristics immediately after applied voltage was applied repetitively $10^{10}$ times), especially piezoelectric constant d31 was considerably degraded for the comparison examples 3 and 4.

[Evaluation of Discharging by Liquid Droplet Head]

Next, the liquid droplet discharging heads 250 of FIG. 13 were produced using the electromechanical transducing devices produced in the embodiments 4-6 and the comparison examples 3, 4, and evaluation of discharging liquid droplets was carried out. An ink in which viscosity was adjusted to 5 cp was used, and discharging states were checked when applied voltages of −10 through −30 V were applied. As a result, other than the comparison example 3, it was confirmed that discharging could be carried out from any nozzle hole.

As to the comparison example 3, depending on a place of the nozzle, discharging varied and was unstable. There was a place where the adjacent electromechanical transducing films came into contact with one another due to insufficiency of accuracy in repetitive alignment when the patterned SAM film was repetitively produced during the process of producing the electromechanical transducing film. On the other hand, with regard to any one of the embodiments 4-6 and the comparison example 4, such a place where the adjacent electromechanical transducing films came into contact with one another as in the comparison example 3 was not found.

Thus, it has been confirmed that the embodiments 4-6 had the considerable difference in the durability (characteristics immediately after applied voltage was applied repetitively $10^{10}$ times) in comparison to the comparison examples 3 and 4. In other words, it has been confirmed that the electromechanical transducing devices produced in the embodiments 4-6 provided stable ink droplet discharging characteristics including the durability. It is noted that the reason why the satisfactory result could not be obtained from the comparison example 3 seems that the area at which the electromechanical transducing film 215 was formed was not be made to have a hydrophilic nature. Further, the reason why the satisfactory result could not be obtained from the comparison example 4 seems that the second electrode 214 made of the metal was not produced on the first electrode 213 made of the electrically conductive oxide.

Figure 15:
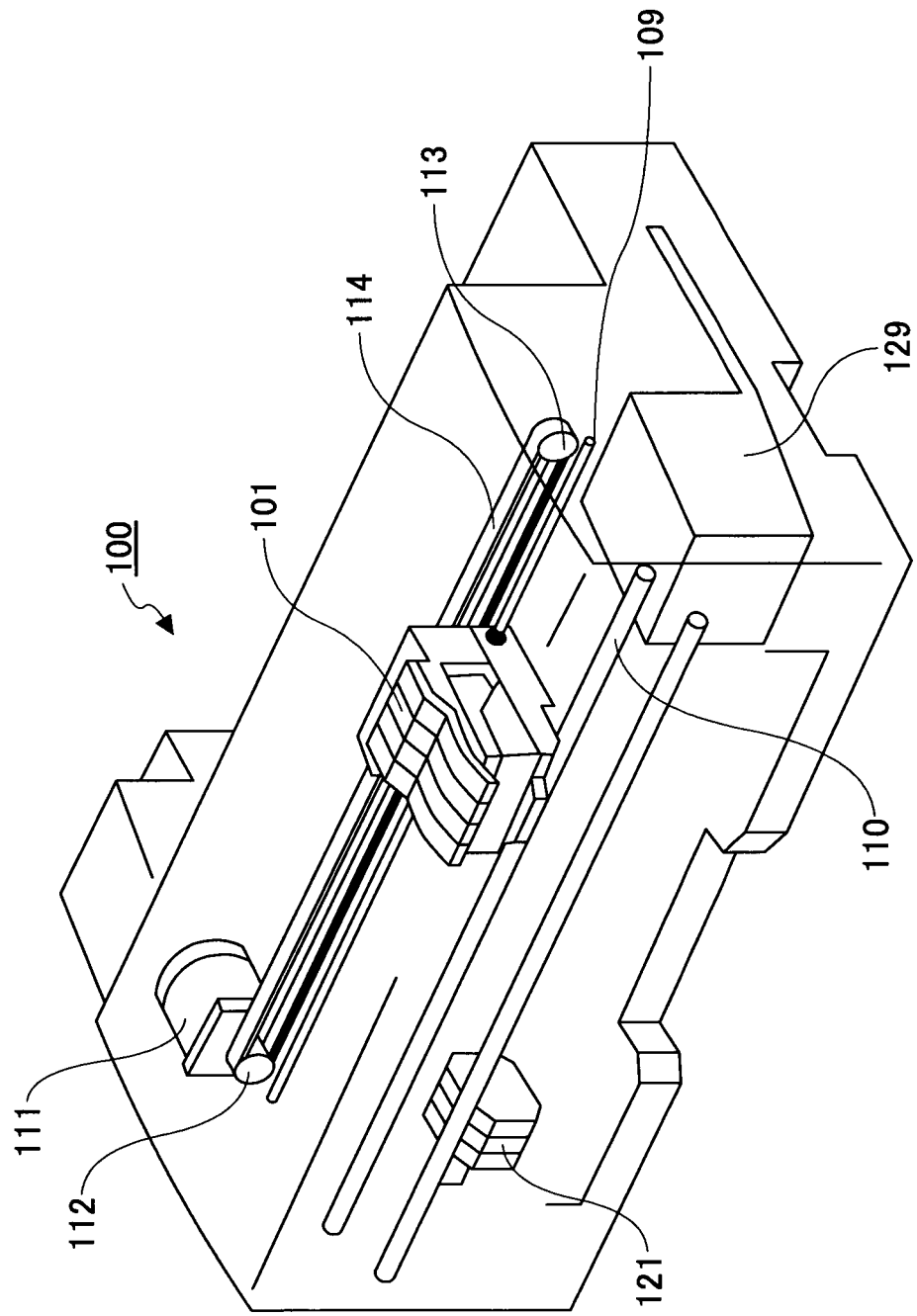
FIG. 15 is a perspective view illustrating an ink-jet recording apparatus.
Figure 16:
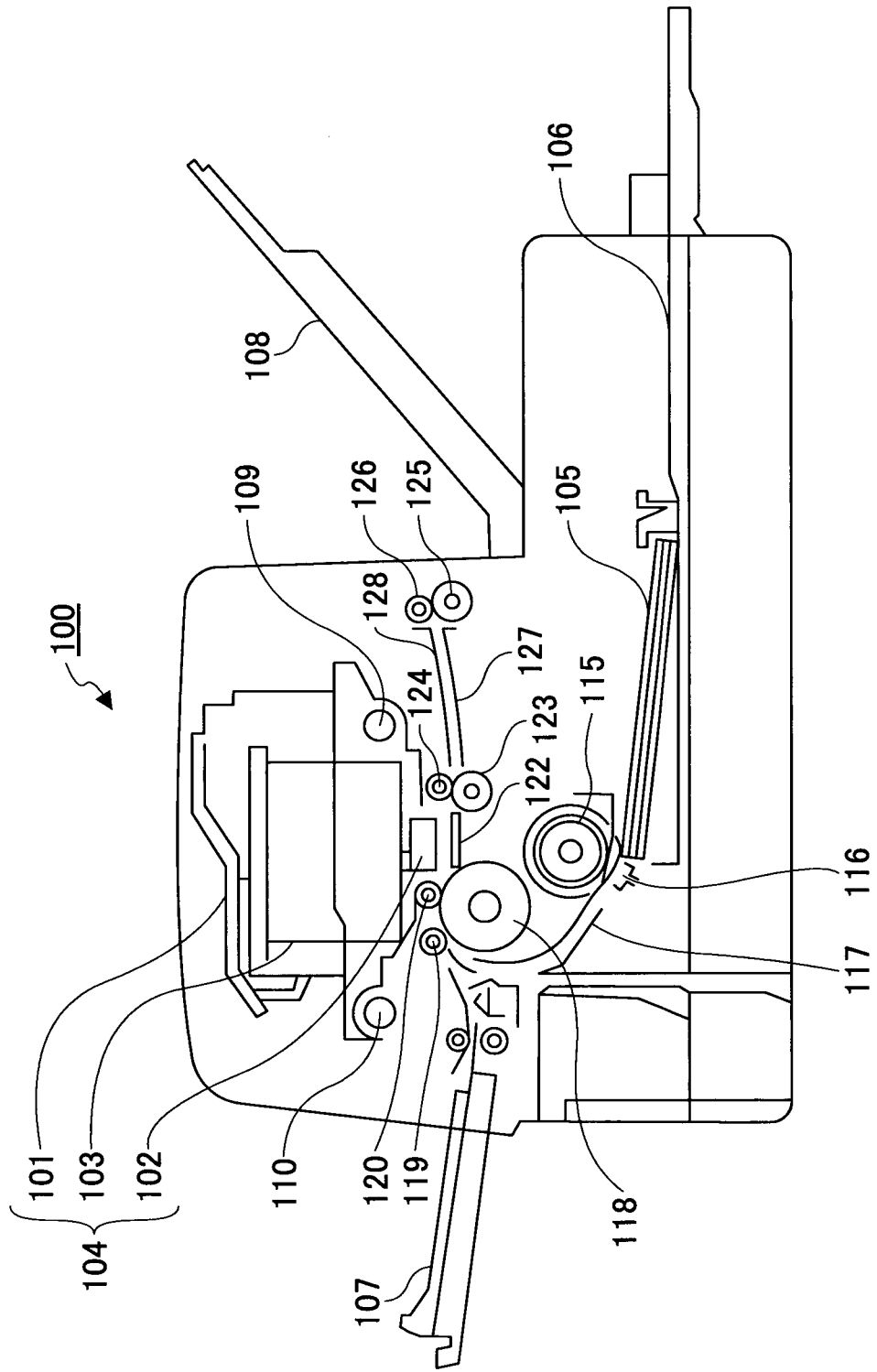
FIG. 16 is a side elevation view illustrating an ink-jet recording apparatus.

Next, one example of an ink-jet recording apparatus in which a liquid droplet discharging head having the electromechanical transducing device produced in the method according to any one of the embodiments 1-6 is mounted will be described with reference to FIGS. 15 and 16. It is noted that FIG. 15 is a perspective view illustrating one example of the ink-jet recording apparatus and FIG. 16 is a side elevation view illustrating the ink-jet recording apparatus. It is noted that the ink-jet recording apparatus is a typical example of a liquid droplet discharging apparatus.

With reference to FIGS. 15 and 16, the ink-jet recording apparatus 100 mainly includes, in the inside of the apparatus body, a printing mechanism part 104 that includes a carriage 101, recording heads 102, and ink cartridges 103. The carriage 101 is moveable along main scan directions. The recording heads 102 are mounted in the carriage 101. The ink cartridges 103 supply inks to the recording heads 102. It is noted that the recording heads 102 are the liquid discharging heads (ink-jet heads) having the electromechanical transducing devices produced in the method according to any one of the embodiments 1-6.

Further, a paper supply cassette 106 in which many sheets of paper 105 can be stacked can be detachably loaded to a bottom part of the apparatus body from the front side. Further, a manual paper supply tray 107 can be opened by which the paper 105 can be manually supplied. In the ink-jet recording apparatus 100, a sheet of paper 105 is supplied from the paper supply cassette 106 or the manual paper supply tray 107, and a desired image is recorded on the sheet of paper 105 by the printing mechanism part 104. Then, the sheet of paper 105 is ejected to a paper ejection tray 108 which is mounted at a rear side part of the apparatus body.

The carriage 101 of the printing mechanism part 104 is slidably supported by a main guide rod 109 and an auxiliary guide rod 110 (acting as guide members) that are horizontally supported by left and right side plates (not shown) of the apparatus body. In the carriage 101, the recording heads 102 that discharge ink droplets of respective colors of yellow (Y), cyan (C), magenta (M) and black (Bk) are arranged in such a manner that plural ink discharging holes (nozzles) are arranged along a direction which intersects the main scan directions. The recording heads 102 are loaded in the carriage 101 in such a manner that the recording heads 102 discharge ink droplets in the downward direction.

Further, the ink cartridges 103 that supply the inks of the respective colors to the recording head 102 are exchangeably loaded in the carriage 101. The ink cartridges 103 have atmospheric holes (not shown) communicating with the atmosphere at the top, supply holes (not shown) supplying the inks to the recording heads 102 at the bottom, and porous members (not shown) into which the inks are supplied in the inside. Capillary forces of the porous members keep the inks supplied to the recording heads 102 having slightly negative pressures. Further, as the recording heads 102, the heads of the respective colors are used here. However, one head having plural nozzles discharging ink droplets of the respective colors may be used instead.

The main guide rod 109 passes through a rear side (the downstream side in the paper conveyance direction) part of the carriage 101 in such a manner that carriage 101 is slidably supported by the main guide rod 109. A front side (the upstream side in the paper conveyance direction) part of the carriage 101 is slidably placed on the auxiliary guide rod 101. In order to move and cause the carriage 101 to carry out scanning in the main scan directions, a timing belt 114 is wound between a driving pulley 102 driven and rotated by a main scan motor 111 and a driven pulley 113. The timing belt 114 is fixed to the carriage 101. As a result of the main scan motor 111 being normally and reversely rotated, the carriage 101 is driven in a go-and-return manner.

In order to convey a sheet of paper 105 set in the paper supply cassette 106 to the lower side of the recording heads 102, a paper supply roller 115, a friction pad 116, a guide member 117, a conveyance roller 118, a conveyance roller 119 and a leading edge roller 120 are provided. The paper supply roller 115 and the friction pad 116 separate and supply the sheet of paper 105 from the paper supply cassette 106. The guide member 117 guides the sheet of paper 105. The convenience roller 118 reverses and conveys the sheet of paper 105. The conveyance roller 119 is pressed onto an outer circumferential surface of the conveyance roller 118. The leading edge roller 120 controls an angle of supplying the sheet of paper 105 from the conveyance roller 118.

The conveyance roller 118 is driven and rotated by a subscan motor 121 via a series of gears (not shown). A printing reception member 122 is provided to correspond to a range of the carriage 101 moving in the main scan directions and act as a paper guiding member that guides the sheet of paper 105 supplied by the conveyance roller 118 below the recording heads 102. On the downstream side along the paper conveyance direction of the printing reception member 122, a conveyance roller 123 and a spur 124 are provided and are rotated and driven for the purpose of forwarding the sheet of paper 105 in a paper ejection direction. Further, a paper ejection roller 125 and a spur 126 are provided to forward the sheet of paper 105 to the paper ejection tray 108. Further, guide members 127 and 128 define a paper ejection path.

At a time of recording, the recording heads 102 are driven according to an image signal while the carriage 101 is being moved in the main scan directions. Thereby, ink droplets are discharged by the recording heads 102 onto the sheet of paper 105 that is stopped. Thus, one line of an image is recorded onto the sheet of paper 105. Then, after the sheet of paper 105 is conveyed a predetermined amount, recording of the subsequent line of the image is carried out on the sheet of paper 105. When a recording end signal or a signal indicating that the trailing edge of the sheet of paper 105 has reached the recording area is received, the recording operation is finished, and the sheet of paper 105 is ejected. Further, a recovery unit 129 for recovering the recording heads 102 from a discharge failure state or such is disposed at a position out of the recording area on the right side in the moving direction of the carriage 101.

The recovery unit 129 has a cap part and a cleaning part (both not shown). The cap part caps the recording heads 102 after the carriage 101 is moved to the recovery unit 129 when the carriage 101 is in a printing waiting state. Thus, discharging hole parts (not shown) of the recording heads 102 are kept in a wet state so that it is possible to avoid discharging failure otherwise occurring due to the inks being dried. Further, the inks not contributing for recording an image are discharged by the recording heads 102 during recording the image, and thus, it is possible to cause the viscosity of the inks in all the discharging holes (not shown) of the recording heads 102 to have a fixed value, and maintain stable discharging performance.

In a case where discharging failure or such occurs, the cap part tightly closes the discharging holes (nozzles) of the recording heads 102, the inks and air bubbles are suctioned from the discharging holes by a suction part via tubes (both not shown). The inks or dust/dirt adhering to the discharging hole faces are removed by the cleaning part, and thus, recovering from the discharging failure is achieved. The suctioned inks are discharged into a waste ink container (not shown) provided at the bottom part of the apparatus body, and are absorbed by an ink absorbing member (not shown) provided in the inside of the waste ink container.

Thus, in the ink-jet recording apparatus 100, the recording heads 102 that are the liquid droplet discharging heads (ink-jet heads) having the electromechanical transducing devices produced by the method of any one of the embodiments 1-6 are mounted. Therefore, ink droplet discharging failure due to failure of driving the vibration plate is avoided, stable ink droplet discharging characteristics are obtained, and the image quality is improved.

Figure 17:
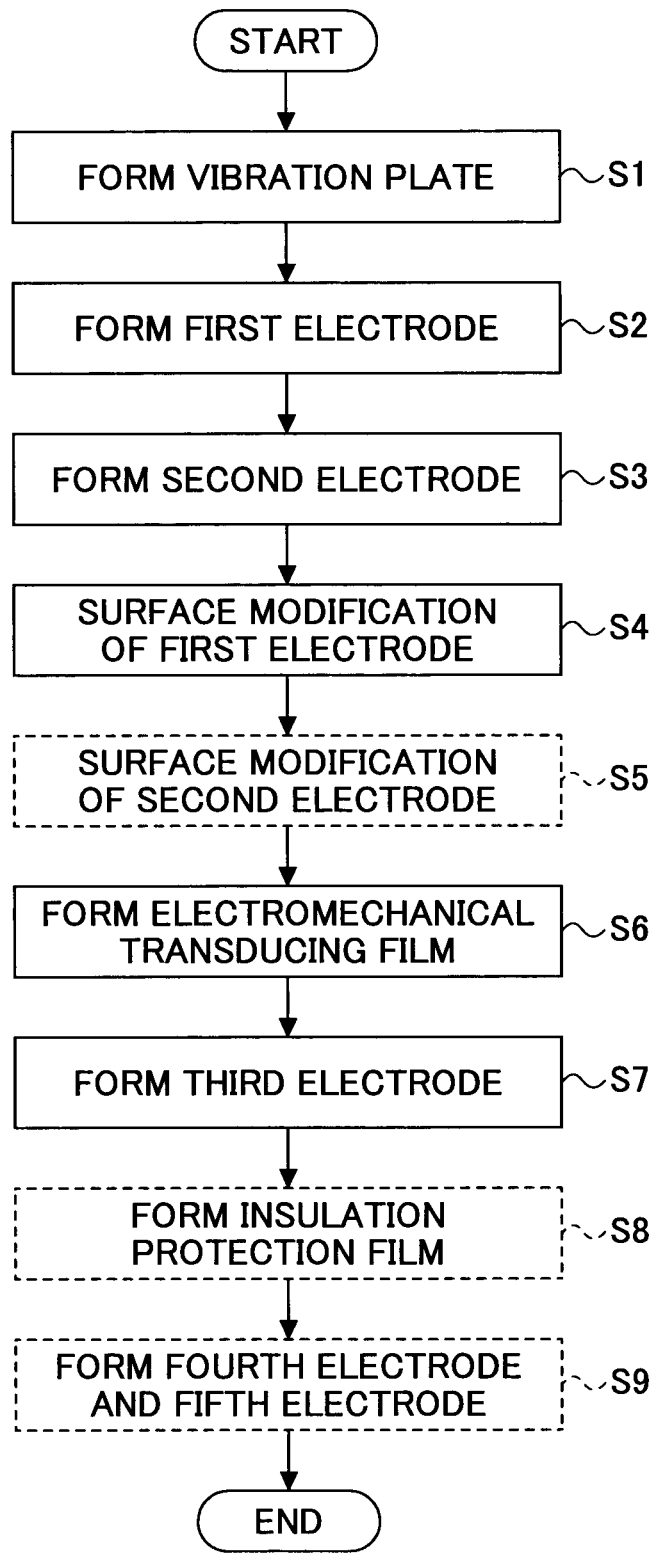
FIG. 17 is a flowchart illustrating a manufacturing method for manufacturing an electromechanical transducing device according to the first mode for carrying out the present invention.

FIG. 17 is a flowchart illustrating a manufacturing method of manufacturing an electromechanical transducing device 10 shown in FIG. 1 and a manufacturing method of manufacturing an electromechanical transducing device 20 shown in FIGS. 3A and 3B, according to the first mode for carrying out the present invention.

The manufacturing method of manufacturing an electromechanical transducing device 10 includes forming a vibration plate 12 on a substrate 11 (step S1); forming a first electrode 13 made of a metal on the vibration plate 12; forming a second electrode 14 made of an electrically conductive oxide on the first electrode 13 (step S3); coating a surface modification material and carrying out surface modification of only the first electrode 13 (step S4); forming an electromechanical transducing film 15 on the second electrode 14 (step S6); and forming a third electrode 16 made of an electrically conductive oxide on the electromechanical transducing film 15 (step S7).

This method may further include, before the forming of the electromechanical transducing film 15 (step S6), carrying out surface modification on the second electrode 14 and causing the second electrode 14 to be hydrophilic (step S5).

The manufacturing method of manufacturing an electromechanical transducing device 20 includes, in addition to the above-described steps S1-S4 and S6-S7 or steps S1-S7, after the forming of the third electrode 16 (S7), forming an insulation protection film 21 having contact holes 22x and 23x and covering the first electrode 13 and the third electrode 16 (S8); forming, on the insulation protection film 21, a fourth electrode 22 made of a metal, communicating with the first electrode 13 via the contact hole 22x and acting as a common electrode (S9); and forming, on the insulation protection film 21, a fifth electrode 23 made of a metal, communicating with the third electrode 16 via the contact hole 23x and acting as an individual electrode (S9).

Thus, for the first mode for carrying out the present invention (embodiments 1-3), even in a case where PZT is used as a material of an electromechanical transducing film, it is possible to avoid diffusion of lead (Pb) by using oxide electrodes as second electrode and the third electrode. Further, by providing a metal electrode having sufficiently low specific resistance as a first electrode, it is possible to supply a sufficient electric current to the common electrodes in a case where voltage driving is carried out, and obtain sufficient displacement amounts without variation among devices (elements) in a case where many piezoelectric elements (electromechanical transducing devices) are simultaneously driven. As a result, it is possible to achieve an electromechanical transducing device from which stable ink discharging characteristics can be obtained.

Figure 18:
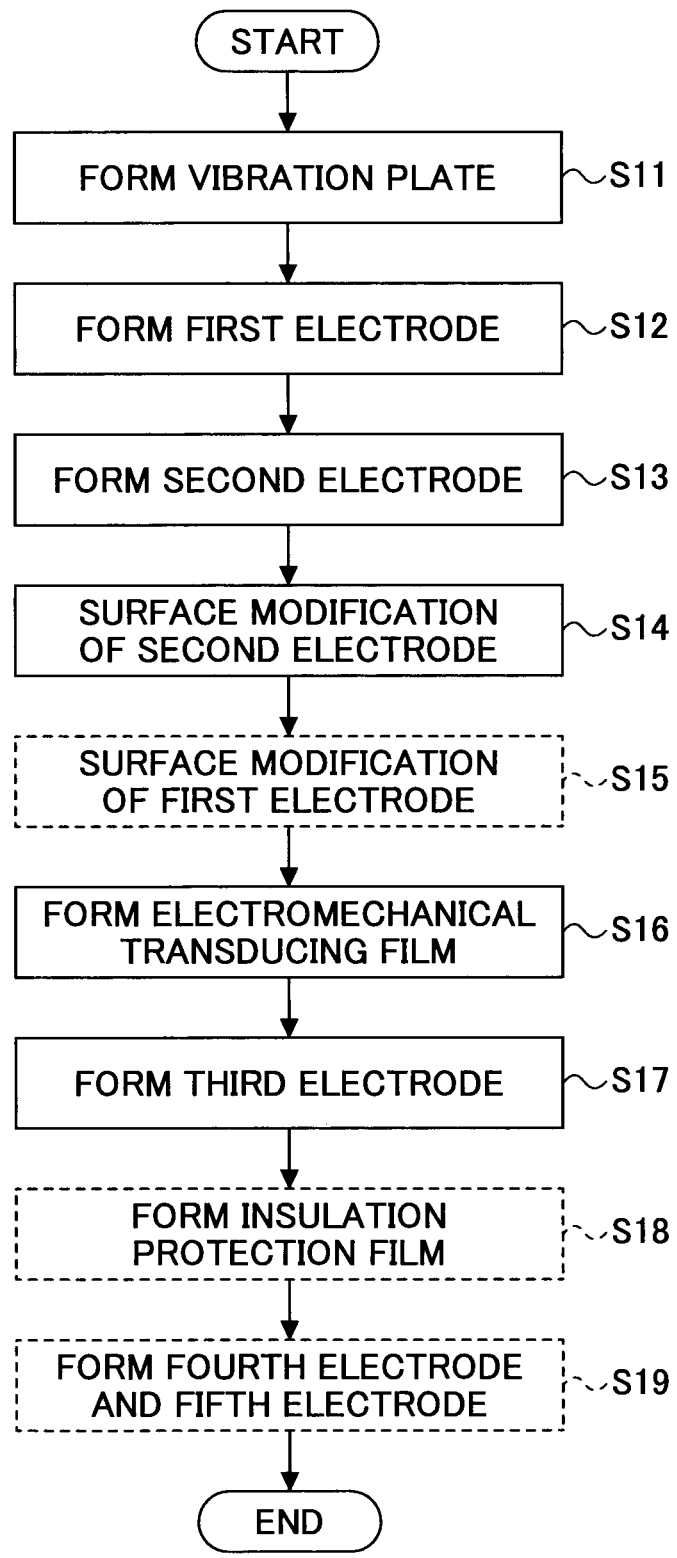
FIG. 18 is a flowchart illustrating a manufacturing method for manufacturing an electromechanical transducing device according to the second mode for carrying out the present invention.

FIG. 18 is a flowchart illustrating a manufacturing method of manufacturing an electromechanical transducing device 210 shown in FIG. 9 and a manufacturing method of manufacturing an electromechanical transducing device 220 shown in FIGS. 11A and 11B, according to the second mode for carrying out the present invention.

The manufacturing method of manufacturing an electromechanical transducing device 210 includes forming a vibration plate 212 on a substrate 211 (step S11); forming a first electrode 213 made of an electrically conductive oxide on the vibration plate 212 (step S12); forming a second electrode 214 made of a metal on the first electrode 213 (step S13);

coating a surface modification material and carrying out surface modification of only the second electrode 214 (step S14); forming an electromechanical transducing film 215 on the first electrode 213 (step S16); and forming a third electrode 216 made of an electrically conductive oxide on the electromechanical transducing film 215 (step S17).

This method may further include, before the forming of the electromechanical transducing film 215 (step S16), carrying out surface modification on the first electrode 213 and causing the first electrode 213 to be hydrophilic (step S15).

The manufacturing method of manufacturing an electromechanical transducing device 220 includes, in addition to the above-described steps S11-S14 and S16-S17 or steps S11-S17, after the forming of the third electrode 216 (S17), forming an insulation protection film 221 having contact holes 122x and 123x and covering the second electrode 214 and the third electrode 216 (S18); forming, on the insulation protection film 221, a fourth electrode 222 made of a metal, communicating with the second electrode 214 via the contact hole 22x and acting as a common electrode (S19); and forming, on the insulation protection film 221, a fifth electrode 223 made of a metal, communicating with the third electrode 216 via the contact hole 123x and acting as an individual electrode (S9).

Further, for the second mode for carrying out the present invention (embodiments 4-6), even in a case where PZT is used as a material of an electromechanical transducing film, it is possible to avoid diffusion of lead (Pb) by using oxide electrodes as a first electrode and a third electrode. Further, by providing a metal electrode having sufficiently low specific resistance as a second electrode, it is possible to supply a sufficient electric current to the common electrode in a case where voltage driving is carried out, and obtain sufficient displacement amounts without variation among devices (elements) in a case where many piezoelectric elements (electromechanical transducing devices) are simultaneously driven. As a result, it is possible to achieve an electromechanical transducing device from which stable ink discharging characteristics can be obtained.

Although this invention has been described in detail with reference to the certain modes for carrying out the present invention and embodiments, variations and modifications (including replacements) exist within the scope and spirit of the invention as described and defined in the following claims, without being limited to the modes for carrying out the present invention and embodiments.

The present Patent Application is based on Japanese Priority Applications No. 2010-207364 filed Sep. 15, 2010 and No. 2010-207365 filed Sep. 15, 2010, the entire contents of which are hereby incorporated by reference.

The invention claimed is:

1. A manufacturing method of manufacturing an electromechanical transducing device comprising:
forming a first electrode made of a metal;
forming a second electrode by an ink-jet method so as to have a desired pattern and being made of an electrically conductive oxide on the first electrode;
coating a surface modification material and carrying out surface modification to only a surface of the first electrode so as to have a water repellency without modifying a surface of the second electrode;
forming an electromechanical transducing film on the second electrode, thereby the surface of the first electrode having the water repellency while the surface of the second electrode has a hydrophilia; and
forming a third electrode made of an electrically conductive oxide on the electromechanical transducing film.

2. The method as claimed in claim 1,
wherein a material of the second electrode is a complex oxide described by a chemical formula of $ABO_3$ and containing, as main constituents, A being any one or more of Sr, Ba, Ca and La and B being any one or more of Ru, Co and Ni, or an oxide including any one of $IrO_2$ and $RuO_2$.

3. A manufacturing method of manufacturing an electromechanical transducing device comprising:
forming a first electrode made of a metal;
forming a second electrode made of an electrically conductive oxide on the first electrode;
coating with a surface modification material and carrying out surface modification of the first electrode;
forming an electromechanical transducing film on the second electrode; and
forming a third electrode made of an electrically conductive oxide on the electromechanical transducing film,
wherein in the forming of the second electrode, an area on the first electrode other than an area to form the second electrode is made to undergo the surface modification to be water repellent, and the second electrode is formed by an ink-jet method on the area which is to form the second electrode and is not made to be water repellent but is hydrophilic.

4. A manufacturing method of manufacturing an electromechanical transducing device comprising:
forming a first electrode made of a metal;
forming a second electrode made of an electrically conductive oxide on the first electrode;
coating with a surface modification material and carrying out surface modification of the first electrode;
forming an electromechanical transducing film on the second electrode;
forming a third electrode made of an electrically conductive oxide on the electromechanical transducing film;
forming an insulation protection film having contact holes and covering the first electrode and the third electrode after the forming of the third electrode, and forming a fourth electrode directly contacting the first electrode, the fourth electrode being formed so as to be made of a metal, communicate with the first electrode via a hole of the contact holes, and act as a common electrode.

5. The method as claimed in claim 4, further comprising:
forming, on the insulation protection film, a fifth electrode made of a metal, communicating with the third electrode via a hole of the contact holes and acting as an individual electrode.

* * * * *